United States Patent
Ali et al.

(10) Patent No.: US 7,696,013 B2
(45) Date of Patent: Apr. 13, 2010

(54) CONNECTING MICROSIZED DEVICES USING ABLATIVE FILMS

(75) Inventors: M. Zaki Ali, Mendota Heights, MN (US); A. Peter Stolt, Edina, MN (US); Gilbert A. Hawkins, Mendon, NY (US); Thomas M. Stephany, Churchville, NY (US)

(73) Assignee: Eastman Kodak Company, Rochester, NY (US)

( * ) Notice: Subject to any disclaimer, the term of this patent is extended or adjusted under 35 U.S.C. 154(b) by 221 days.

(21) Appl. No.: 11/737,187

(22) Filed: Apr. 19, 2007

(65) Prior Publication Data

US 2008/0258313 A1    Oct. 23, 2008

(51) Int. Cl.
*H01L 21/00* (2006.01)
(52) U.S. Cl. .................... 438/118; 438/106; 438/940
(58) Field of Classification Search .......... 257/E21.505, 257/778, E21.218; 430/322; 438/106, 119, 438/940
See application file for complete search history.

(56) References Cited

U.S. PATENT DOCUMENTS

| | | | |
|---|---|---|---|
| 5,472,539 A * | 12/1995 | Saia et al. .................... 156/155 |
| 6,752,966 B1 * | 6/2004 | Chazan ........................ 422/102 |
| 6,987,312 B2 | 1/2006 | Theuss | |
| 7,115,514 B2 | 10/2006 | Stoltz | |
| 2005/0227182 A1 | 10/2005 | Ali et al. | |
| 2005/0244955 A1 * | 11/2005 | Li et al. .................... 435/287.2 |
| 2006/0057293 A1 | 3/2006 | Sharma et al. | |
| 2006/0063111 A1 * | 3/2006 | Ali et al. ..................... 430/322 |
| 2006/0118233 A1 * | 6/2006 | Wargo et al. ................ 156/247 |
| 2006/0134799 A1 | 6/2006 | Sharma et al. | |
| 2007/0220970 A1 | 9/2007 | Gruber | |

FOREIGN PATENT DOCUMENTS

| | | |
|---|---|---|
| WO | 02/086162 | 10/2002 |
| WO | 2004/083802 | 9/2004 |
| WO | 2006/088427 | 8/2006 |

OTHER PUBLICATIONS

Wolf et al., Silicon Processing for the VLSI Era, 2000, Lattice Press, pp. 828-829; 848-851.*

Nieweglowski et al., "Optical Interconnections on PCBs—Recent Development", 2004, 2004 International Student and Young Scientist Workshop, pp. 35-39.*

Rosenthal, "Application of Ultrasonic Light Modulation . . . ", 1961, IRE Transactions on Ultrasonic Engineering, vol. 8, pp. 1-5.*

(Continued)

*Primary Examiner*—Thomas L Dickey
*Assistant Examiner*—Nikolay Yushin
(74) *Attorney, Agent, or Firm*—Peyton C. Watkins

(57) ABSTRACT

A method of providing connectivity to a microsized device, the method includes the steps of providing an ablative base material having at least a top surface; providing a die having a first and second surface and having bonding pads at least upon the first surface; placing the die with the at least first surface of the die contacting the at least first surface of the ablative base material; and ablating a channel in the ablative material proximate to the die.

13 Claims, 20 Drawing Sheets

OTHER PUBLICATIONS

Bustillo et al., Surface Micromachining for Microeletromechanical Syatems, 1998, Proceedings of the IEEE, vol. 86, No. 8, pp. 1552-1574.*

Griese, "A high-performance hybrid electrical-optical interconnection technology for high-speed electronic systems", 2001, IEEE Transactions on advanced packaging, vol. 24, No. 3, pp. 375-383.*

Van Steenberge et al., "MT-Compatible Laser-Ablated Interconnections for Optical Printed Circuit Boards", 2004, Journal of Lightwave Technology, vol. 22, No. 2, pp. 2083-2090.*

Butler et al., "Extension of High Density Interconnect Multichip Module Technology for MEMS Packaging", 1997, Proc. of SPIE, vol. 3224, pp. 169-177.*

J. T. Butler, et al., Extension of High Density Interconnect Multichip Module Technology for MEMS Packaging, Proceedings of SPIE—The International Society for Optical Engineering, SPIE, Bellingham, VA, vol. 3224, Sep. 29, 1997, pp. 169-177.

A. P. Malshe, et al., "Challenges in the Packaging of MEMS", International Journal of Microcircuits and Electronic Packaging, International Microelectronics & Packaging Society, vol. 22, No. 3, Sep. 21, 1999, pp. 233-241.

* cited by examiner

CONNECTING MICROSIZED DEVICES USING ABLATIVE FILMS

FIELD OF THE INVENTION

The invention relates generally to the field of microsized devices and in particular to processes providing connections to microsized devices, including processes based on the use of ablative films to connect a plurality of microsized devices to one another. More specifically, the invention relates to ablative means for providing fluidic, electrical, photonic, magnetic, and mechanical connections to microsized devices.

BACKGROUND OF THE INVENTION

Microsized devices include, for example, micro-accelerometers and micro-gyroscopes for detecting linear and angular accelerations as manufactured by Analog Devices, Inc., chemically sensitive field effect transistors, used to detect the presence of certain molecular vapors such as carbon monoxide or ethanol, pressure sensors for measurement of pressures in automotive systems or micro phonic sensors, such as those employed in cell phones to detect and reproduce audio sounds, and optical sensors for detecting the presence of objects by infra-red radiation. These and other microsized devices are well known to practitioners of micro systems technology (MST). Also well known in that art are the difficulties encountered in inexpensive packaging of such microsized devices, in part because their small sizes require accurate positioning of connections and also because the connections may be of many different types, for example electrical, mechanical, or fluidic (vapor). Because the objects are small, many interconnected devices may be incorporated for systems applications. Additionally, since the devices are small, connections must be made so as not to perturb their functionality, for example by mechanical stress, especially in the face of changes in external environment in which collections of devices are operated, such as temperature or humidity.

Previous means employed for the connection of microdevices have included the use of automated wire bonding apparatus, use of ball grid arrays technology, fabrication of special packages using materials having temperature matched expansion coefficients, and the use of packages encapsulating devices in inert or chemically controlled atmospheres. Although these techniques offer sophisticated solutions, their implementation is not without expense, as is well known, for example, in the case of the packaging of micromirror devices (MMD) as manufactured by Texas Instruments, Inc. More recently, lower cost solutions have become available for mounting and connecting arrays of microsized devices on polymer films, for example those using films on which are patterned conductive lines, which may be deposited by many techniques, including ink jet printing of fluids. Such fluids may be conductive as deposited or may become conductive upon subsequent processing, for example by thermal annealing. These films are typically flexible and therefore are less likely to perturb the functionality of the microsized devices by mechanical stress.

One means of depositing conductive lines, related to the present invention, is by depositing conductive fluids to fill channels made in polymer films, for example channels made by laser ablation of polymer films, hereinafter referred to as ablative films. As is well known in the art of MST, microsized devices may then be placed proximate to the conductive lines; and connections, typically electrical, may be made using a variety of techniques, including wire-bonding, flip chip bonding, electroplating, and deposition of conductive materials, including deposition of conductive fluids by inkjet means, typically to ensure the reliable connection of electric leads to the devices or "die."

Referring to FIG. 1a, there is shown a cross-section of a prior art ablative film 5. The ablative film 5 includes a substrate 10, typically a flexible polymer such as a polyamide or polycarbonate, and one or more energy-absorbing layers 20 which can be removed, all or in part, by exposure to intense radiation, or in other words, can be ablated, for example by radiation from a near IR laser. Ablative film compositions which can be removed by radiation from a near IR laser are disclosed, for example, by M. Zaki Ali, et al. in US Patent Publication 2005/0227182, which further contemplates using the ablative films, once ablated, as photolithographic masks for subsequent image wise ultraviolet exposure of flexography materials. The ablative films described in US 2005/0227182 may contain additional layers which serve purposes other than of a substrate or of energy absorbing layers, for example release layers used in lamination and surface energy control layers for repelling liquids, so that the ablative films, once ablated, may serve a variety of purposes. Many other material types of polymeric ablative films and laser ablation processes are well known in the art of laser ablation and laser processing for the manufacture of patterns and structures. For example, U.S. Pat. No. 7,115,514 by Richard Stoltz and assigned to Raydiance, Inc., describes a laser ablation process using short pulses at wavelengths shorter than the near IR are described for ablating a wide variety of materials including metals and inorganic materials and for altering their surfaces by ablation.

Referring to FIG. 1b, there is shown a cross-section of another prior art ablative film 5 of a more complex structure. The ablative film 5 includes a substrate 10, and multiple layers 30, some of which are energy absorbing layers. These layers can be removed, all or in part, by exposure to intense radiation. Other layers may provide desired colors or surface properties, such as hydrophobicity, or may comprise release layers to allow separation of the layers, and may be removed (ablated) when nearby underlying or overlying energy absorbing layers absorb radiation.

Referring to FIGS. 2a-2b, there is illustrated in cross-section and top-view, respectively, prior art formation of a channel 40 in an ablative film 5 of FIG. 1a. The ablative film 5 includes the two energy-absorbing layers 20 and the substrate 10 as described above. The base 50 of the channel 40 may be altered by the ablation process, for example its surface may be rendered hydrophilic.

Among the many known uses for ablative films, subsequent to patterning by ablation, are those relying on the geometry and surface properties of the ablated film to confine deposited fluids, such as fluids containing conductive materials such as metallic particulates. These fluids are typically deposited by well-known techniques such as ink-jetting or immersion in fluid baths followed by removal, for example by mechanical wiping blades, of excess fluid not in the ablative channels. Referring to FIG. 2c, there is illustrated in cross-section a prior art process for forming an electrically conductive material 60 in an ablated channel 40 in the ablative film 5. For example, the conductor 60 may be formed by jetting (preferably by inkjet printing means) a liquid containing a metallic precursor into the channel 40 and then annealing the liquid to form the conductor 60. The conductor 60, as commercialized, for example by Dimatix, Inc. and Cabot Corporation.

The deposition of conductors in channels formed in polymeric films has further been employed to connect together microsized devices electrically, for example by positioning microsized devices on the top surface of polymer films having conductors patterned in channels or on the film surface, the positioning means being one of mechanical placement or, alternatively self assembly, as practiced by Alien Technologies, Inc. The microsized devices are positioned in an approximate way near the conductors and then one or more conductive metal strips are deposited which extend from the microsized device(s) to the conductor(s) to establish electrical connections. Methods of self-aligned positioning include alignment by matching geometrical features built into both the microsized devices and the substrate or the use of chemical constituents deposited pattern wise on the substrate which attract matching chemical constituents applied to the microsized devices as referenced in Sharma, et al., US Patent Publication 2006/0134799 and Sharma, et al., US Patent Publication 2006/0057293. For example, optically emitting diodes arrays may be so formed for display applications.

Although such prior art techniques can provide useable arrays of interconnected devices, the process of placement of the microsized devices must be sufficiently accurate to allow for the cost effective provision of connections, for example connections made of conductive metal strips to establish electrical connections. Such accuracy is generally difficult to achieve for self-aligned processes and expensive to achieve by precision pick and place technologies. Moreover, the deposition of conductive strips is expensive; time consuming and problematic as to reliability if the connection is to be robust on flexible substrates. Additionally, such techniques are not generally applicable to connection types other than electrical, for example connections of the fluidic, magnetic, optical, or mechanical types or connections of mixed types.

SUMMARY OF THE INVENTION

The present invention is directed to overcoming one or more of the problems set forth above. Briefly summarized, according to one aspect of the present invention, the invention resides in a method of providing connectivity to a microsized device, the method comprising the steps of providing an ablative base material having at least a top surface; providing a die having a first and second surface and having bonding pads at least upon the first surface; placing the die with the at least first surface of the die contacting the at least top surface of the ablative base material; and ablating a channel in the ablative material proximate to the die.

ADVANTAGEOUS EFFECT OF THE INVENTION

The present invention has the following advantage of expanding use of ablative material to include having microsized devices thereon.

The placement of microsized devices may precede the patterning of the primary routes for connections to or between the devices, including mechanical, optical, magnetic, fluidic, or electrical.

The connections may be combinations of the types above, achieved without substantial process complexity over the individual connection types.

The alignment of the microsized devices to the connections may be of a self-aligned nature without the complexity heretofore required of self-aligned connections to microsized devices.

Records of the position and alignment of microsized devices are included in the manufacturing process.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Microsized means devices whose features critical to functionality are typically 1 to 100 microns in linear dimension and which are made in processes involving photolithographic exposure of layers of materials to be patterned by subsequent processing. A micro-fluidic device means a microsized device whose principal functionality is the transport, analysis, and dispensation of fluid materials (gases and liquids) or information concerning the nature of the analyzed fluidic materials, such as, but not limited to sensors of chemical or biological materials and their physical and chemical properties. Micro-fluidic microdevices may also receive information in analog or digital form including electrical or optical information and produce fluidic signals such as pressure changes or changes in chemical composition in fluid connections in analog or digital form as output. A microsized photonic device receives, processes, and/or transmit information in the form of optical data, including trains of optical pulses, or analog input or output of light including wavelength optical signals and may respond to optical stimulation in a variety of ways, including electrical and mechanical output. Optical microdevices may also receive information in analog or digital form including electrical or mechanical information and produce optical signals in analog or digital form as output. Mechanical microsized devices are sensitive to and can produce mechanical stimuli in analog or digital form including quasi-static mechanical motion as well as acoustic waves and pulses and may a respond to mechanical stimulation in a variety of ways, including electrical and optical output. Mechanical microdevices may also receive information in analog or digital form including electrical and optical information and produce mechanical or acoustical signals in analog or digital form as output. Magnetic microdevices sense magnetic stimuli in analog or digital form including quasi-static magnetic fields as well as time varying fields and may respond to magnetic stimulation in a variety of ways, including producing electrical and optical output. Magnetic microdevices may also receive information in analog or digital form including electrical and optical information and produce magnetic signals in analog or digital form as output.

Figure 1A:
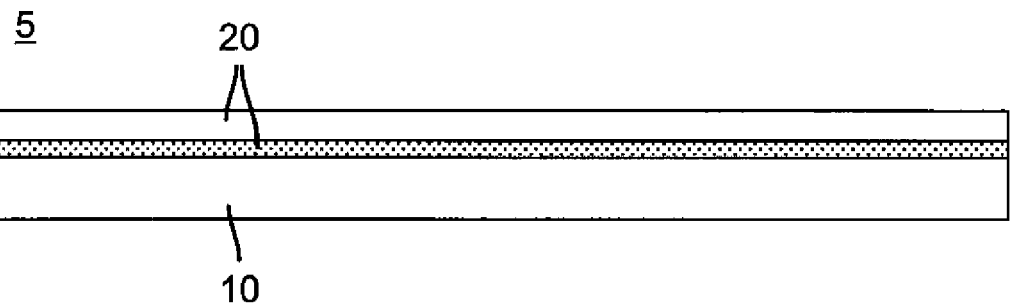
FIG. 1a is a cross-section of a prior art ablative film.
Figure 1B:
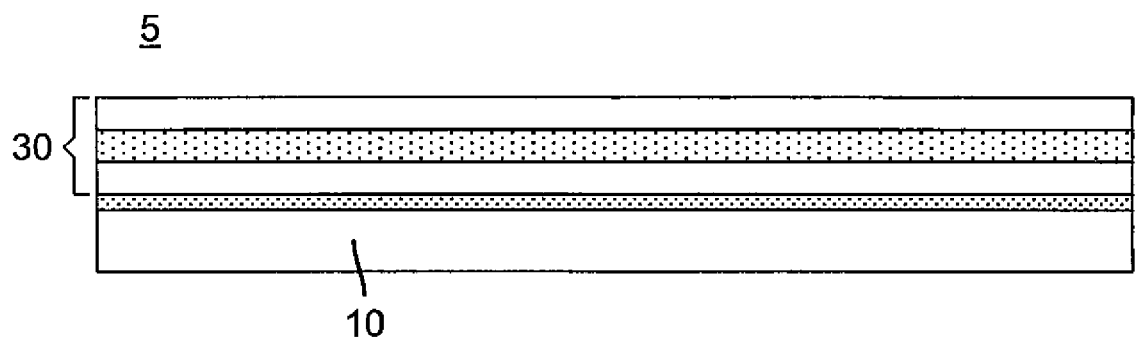
FIG. 1b is a cross-section of a prior art ablative film.
Figure 2A:
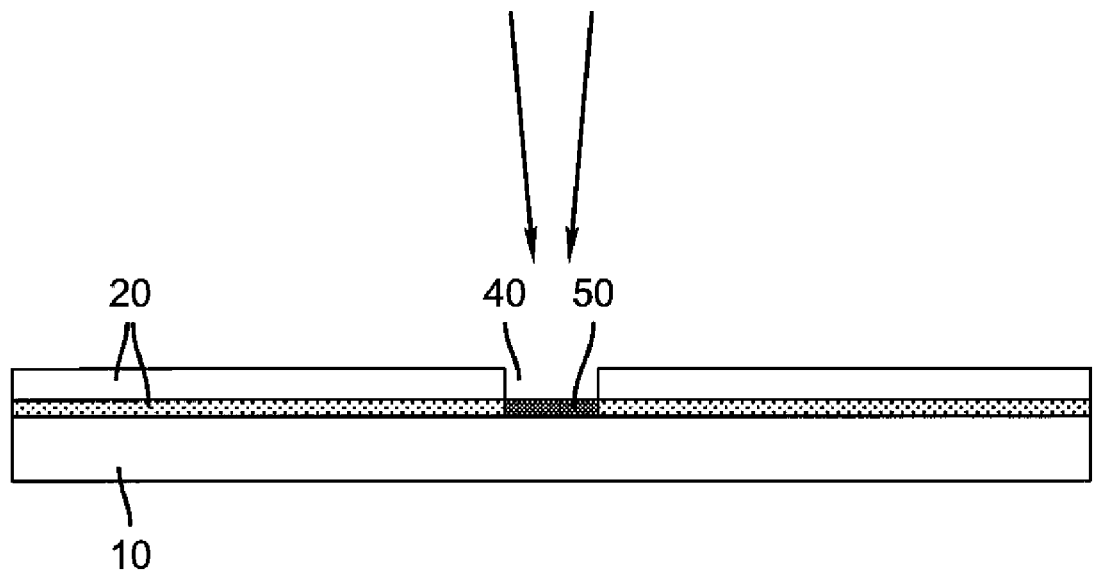
FIGS. 2a-2b illustrate in cross-section and top-view, respectively, prior art formation of a channel in an ablative film.
Figure 2B:
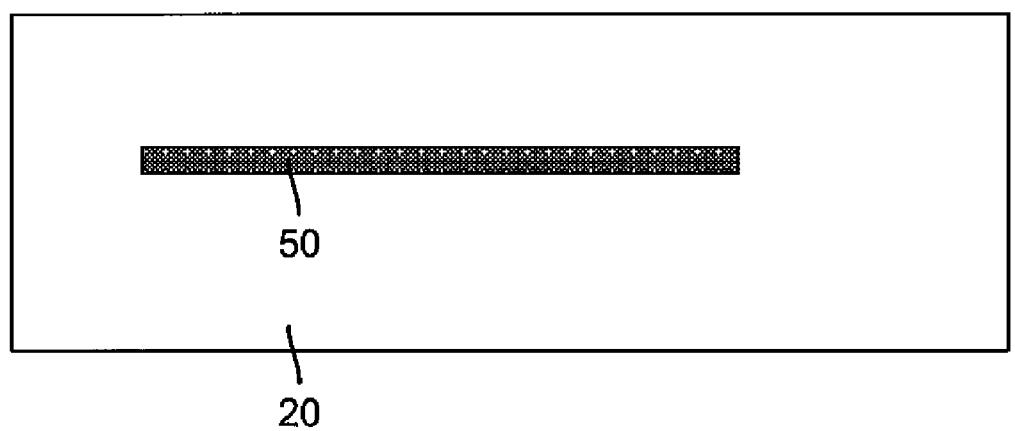
Figure 2C:
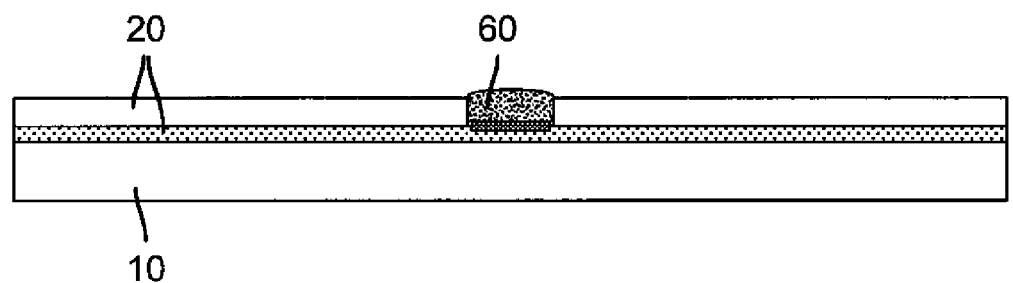
FIG. 2c illustrates in cross-section a prior art process for forming an electrically conductive material in an ablated channel in an ablative film.
Figure 2D:
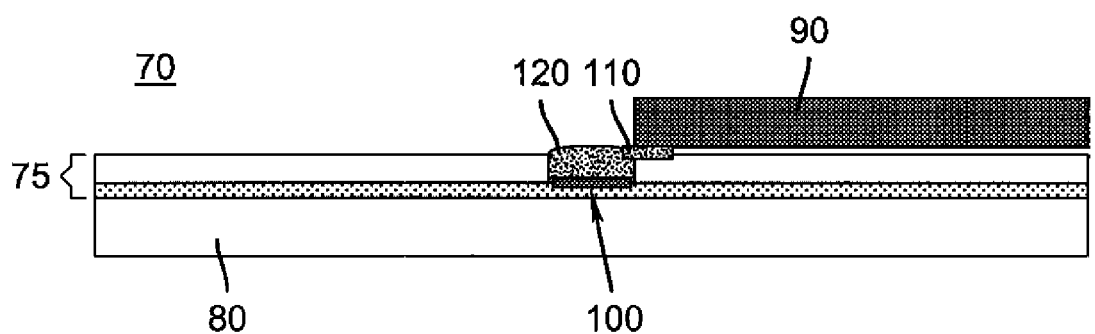
FIG. 2d illustrates schematically in cross-section an embodiment of ablative film 70 of the present invention.

Referring to FIG. 2d, there is shown one embodiment of ablative film 70 of the present invention. The ablative film 70 includes a substrate 80 and two energy-absorbing layers 75 in which a microsized device (die) 90 has been positioned on the top surface of the ablative film 70 and a self-aligned channel 100 is formed in proximity to one edge of the die 90 by laser ablation. As is well known in the art of laser ablation, energy absorbed in one or more energy absorbing layers 75 results in the removal of material from the energy-absorbing layer and, depending on the chemical nature of the surrounding layers, removal of material from adjacent layers. The die 90 in FIG. 2d is provided with one or more contact regions comprising metallic bond pads 110 on the side facing the ablative film. A liquid 120 containing a metallic precursor has been jetted, for example by inkjet printing means, into the channel 100. A metallic precursor is a fluid which, when dried or annealed, is an electrical conductor, as is well know in the art of printed electronics. The liquid 120 containing a metallic precursor in FIG. 2d fills the channel 100 and has flowed under portions of the die 90 adjacent the channel, thereby providing, when annealed, an electrical and mechanical connection to the die 90 by direct contact to the metallic bond pad 110. Advantageously, the electrical connection to the die 90 is made simultaneously with the process of deposition of the fluid into channel 100.

Figure 3A:
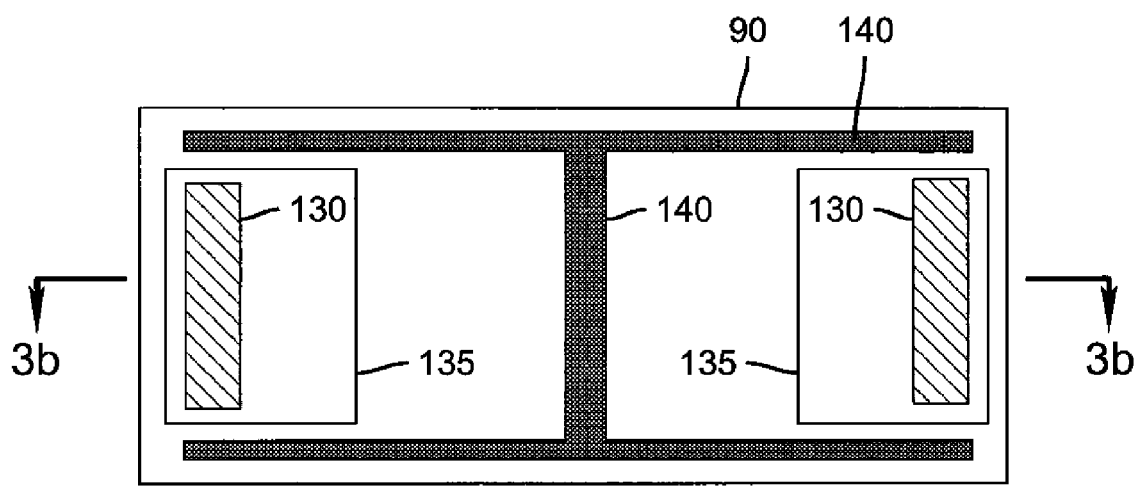
FIG. 3a-b shows top and cross-sectional views of the microsized device of the present invention having two contact regions.
Figure 3B:
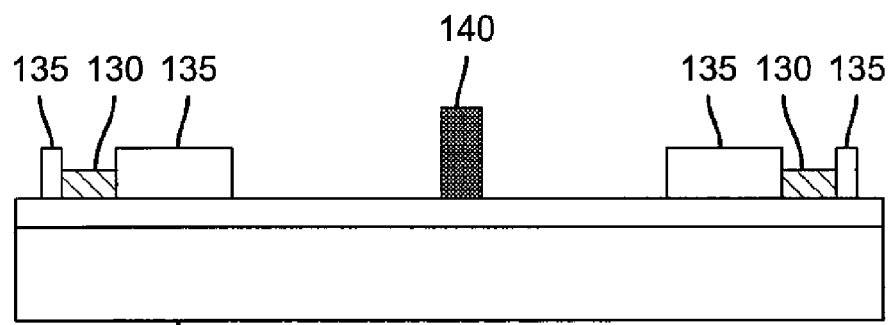

Referring to FIGS. 3a-3b, there is shown top and cross-sectional views of the microsized device 90 (die). The microsized device 90 includes two contact regions 130 (disposed symmetrically) partially protected by protective layers 135 and having a raised support structure 140 between and along the sides of the contact regions 130. Provision of the die 90 with support structure 140 is advantageous in making various types of connections to the die 90, as will be described.

Figure 3C:
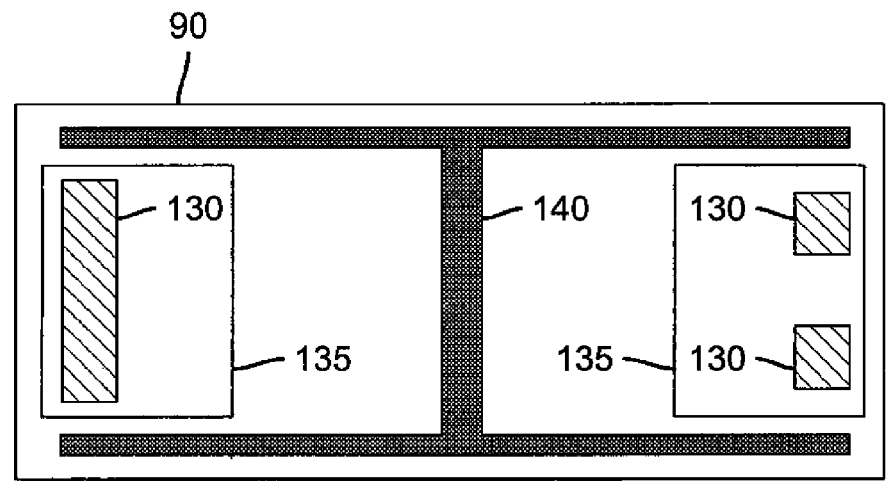
FIG. 3c shows a top view of a microsized device having three contact regions.

Referring to FIG. 3c, there is shown a top view of an alternative embodiment of the microsized device 90 (die) having three contact regions 130 partially protected by protective layers 135 and having a raised support structure 140 separating some of the contact regions 130.

Figure 3D:
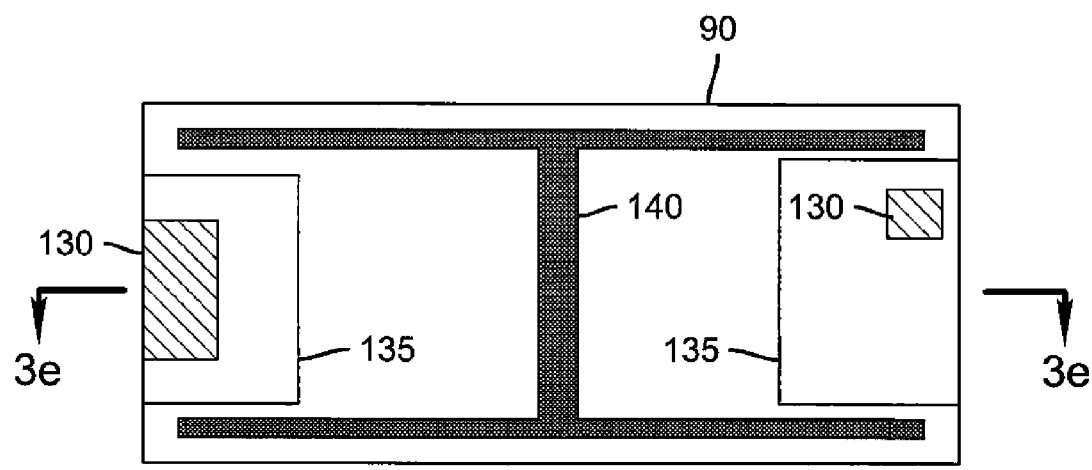
FIG. 3d is an alternative embodiment of FIGS. 3a-b showing a top view of a microsized device of the present invention having two contacts.

Referring to FIG. 3d, there is shown a top view of an alternative embodiment of the microsized device 90 (die) having two contact regions 130 (disposed non-symmetrically) partially protected by protective layers 135 and having a raised support structure 140 separating the contact regions. The protective layers 135 do not extend to the edge of the die 90 in portions of the contact regions 130 in order to provide a more direct path for liquids subsequently deposited near the edge of the die 90 to flow to the contact regions 130.

Figure 3E:
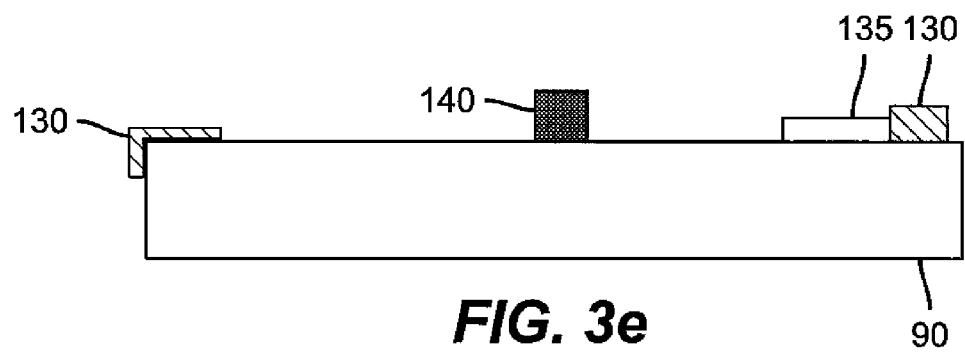
FIG. 3e shows a cross-section of a microsized device (die) having a contact region (solid fill) partially extending from the top of the die over its left edge.

Referring to FIG. 3e, there is shown a cross-sectional view of an alternative embodiment of the microsized device 90 (die) having a contact region 130 disposed partially extending from the top of the die 90 over its left edge, in order to provide a more direct path for liquids subsequently deposited near the edge of the die 90 to flow to the contact regions 130. Although FIG. 3d illustrates electrical connection to the die 90, the location of protective layer 135 as shown in FIG. 3d and the use of the raised support structures 140 are useful in providing all types of contacts to the die 90.

Figure 4A:
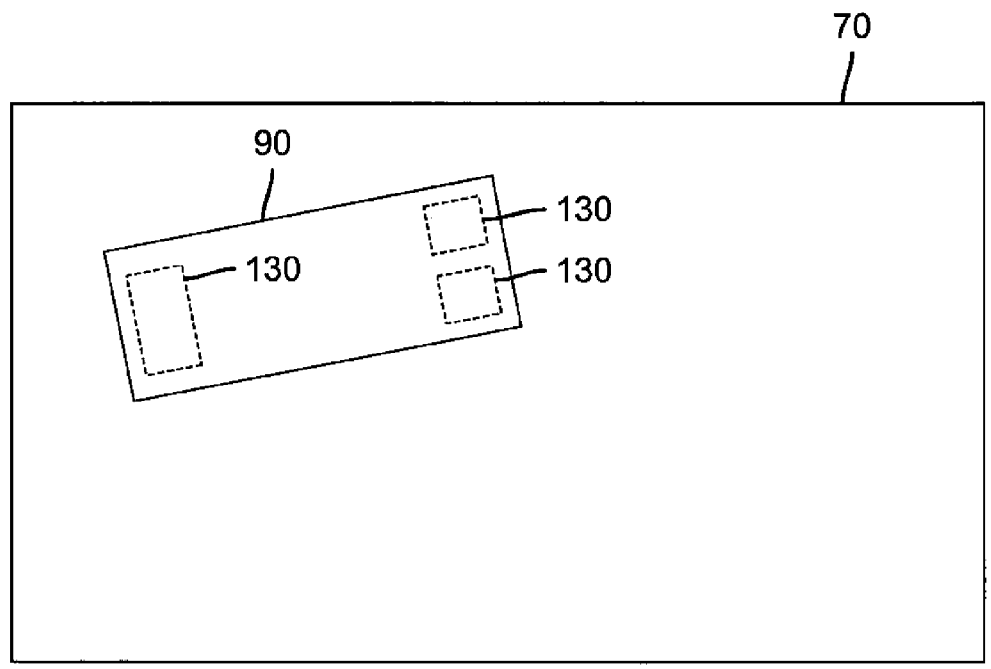
FIG. 4a shows a view of a microsized device (die) having three contact regions (dotted lines) placed with its top-side down on the top surface of an ablative film.

Referring to FIG. 4a, there is shown a top view of the microsized device 90 (die) having three contact regions 130 placed with its top-side down on the top surface of an ablative film 70. The die 90 has been lightly affixed to the ablative film 70, for example by pressing into the film 70 under heat or by depositing a small amount of adhesive (not shown) to portions of the die 90, for example to the raised support structure 140 (not visible in this top view as it lies adjacent the top surface of the substrate) separating some of the contact regions 130. Note the die 90 is not placed with precision; that is, the die center and the angle of the die 90 with respect to the ablative film 70 are not precisely controlled.

Figure 4B:
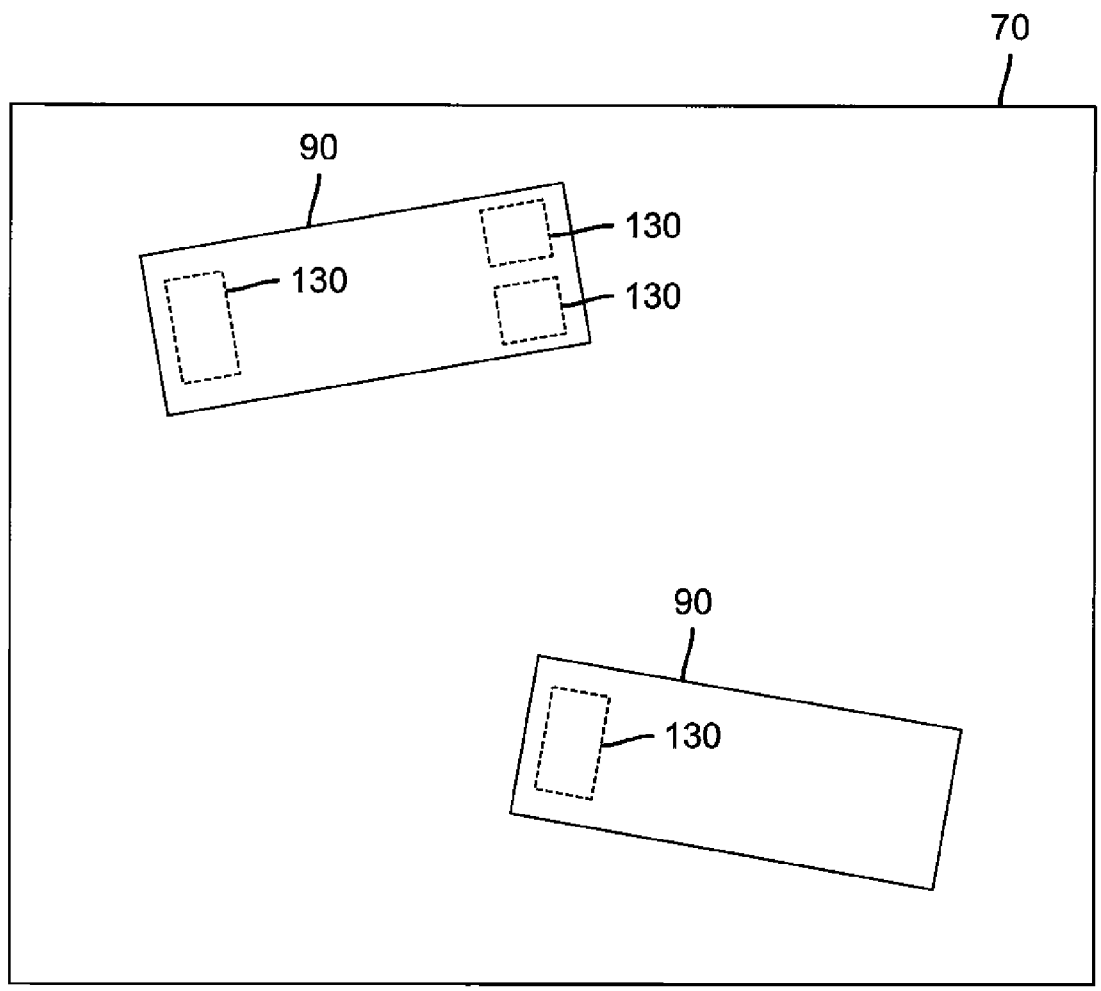
FIG. 4b shows a view of two microsized devices (die) having contact regions (dotted lines) placed top-side down on the top surface of an ablative film.

Referring to FIG. 4b, there is shown a view of two microsized devices 90 (die) having contact regions 130 placed top-side down on the top surface of an ablative film 70. The die 90 has been lightly affixed to the ablative film 70, for example by pressing into the film 70 under heat or by depositing a small amount of adhesive to portions of the die 90. It is noted the die 90 are not placed with precision; that is, the die centers and the angles of the die 90 with respect to the ablative film 70 and to one another are not precisely controlled.

Figure 4C:
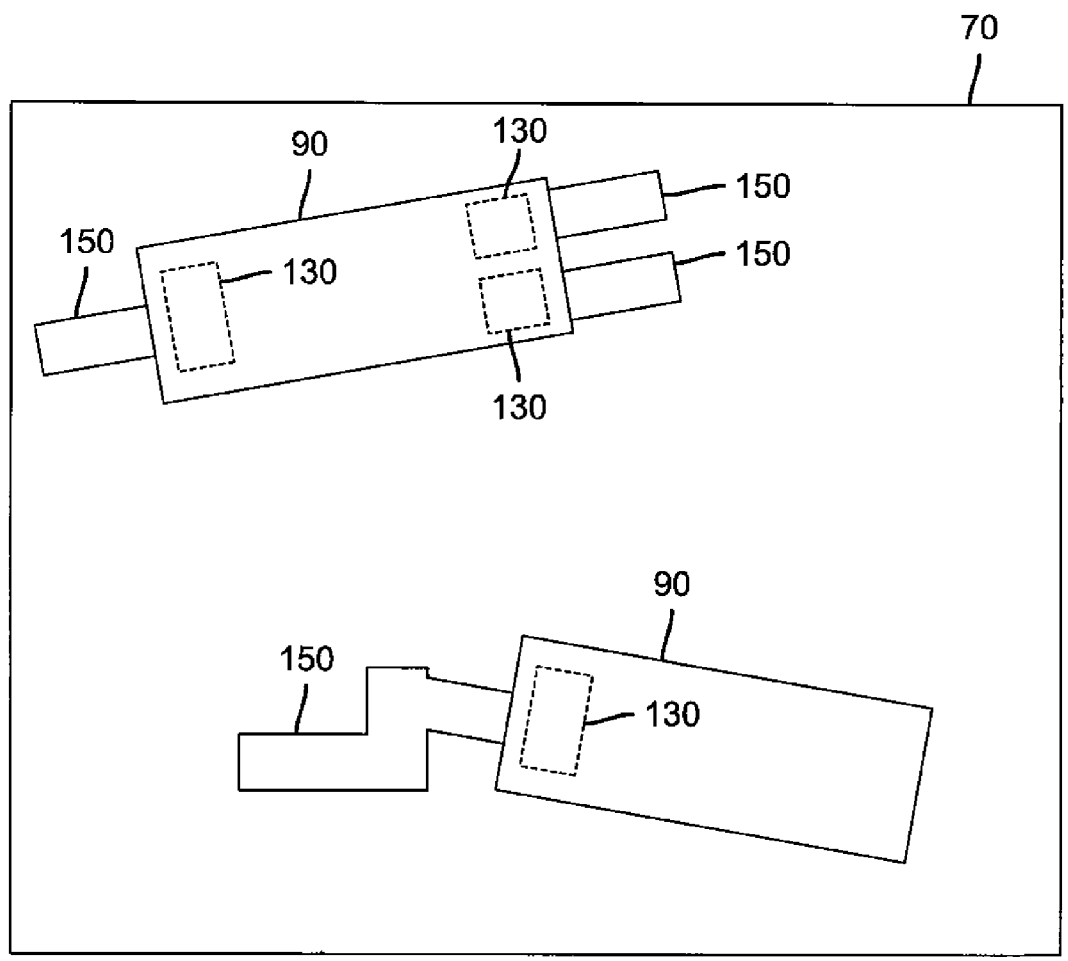
FIG. 4c shows the two die of FIG. 4b including channels formed by laser ablation of the ablative film extending to the contact regions.

Referring to FIG. 4c, there is shown the two die 90 of FIG. 4b. Channels 150 are preferably formed by laser ablation of the ablative film 70 extending to the contact regions 130. The channels 150 are formed in a manner such that the channel direction is aligned with the direction of the chip, that is, in FIG. 4c, the channel 150 is formed perpendicular to the edge of the chip nearest the contact region 130, despite the fact that the chip has been oriented at an angle to the edge of the ablative film 70.

Figure 4D:
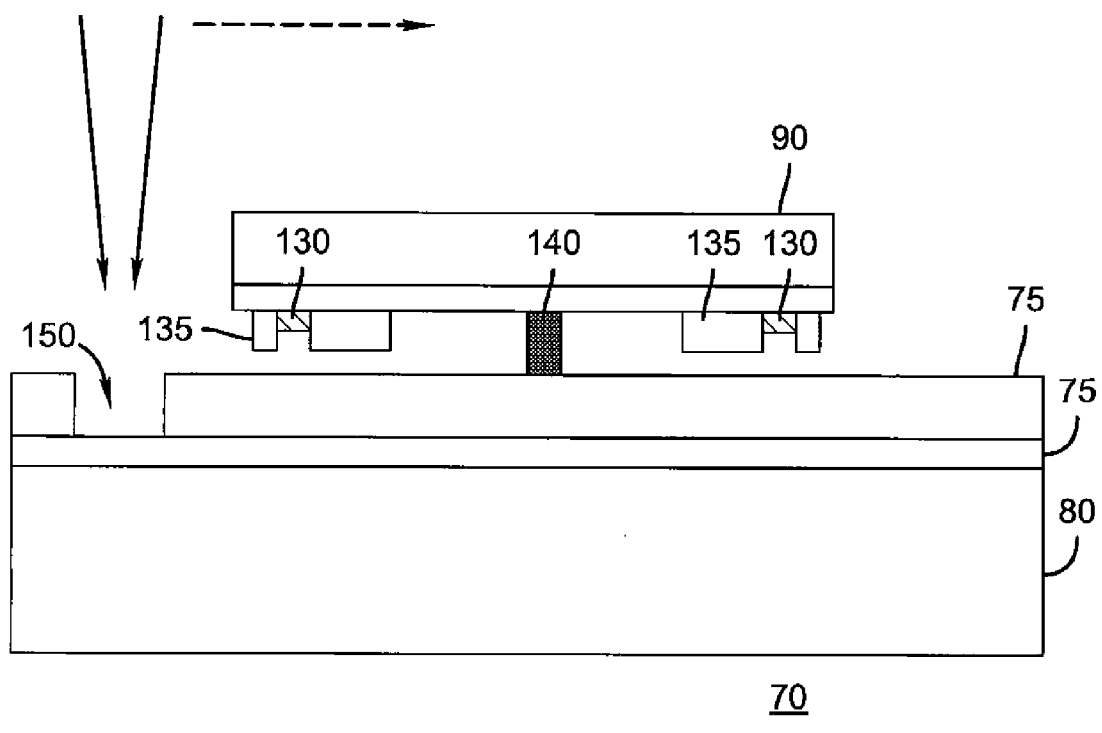
FIGS. 4d-4e illustrate a process for forming the channels of FIG. 4c in a self-aligned manner to the die.
Figure 4E:
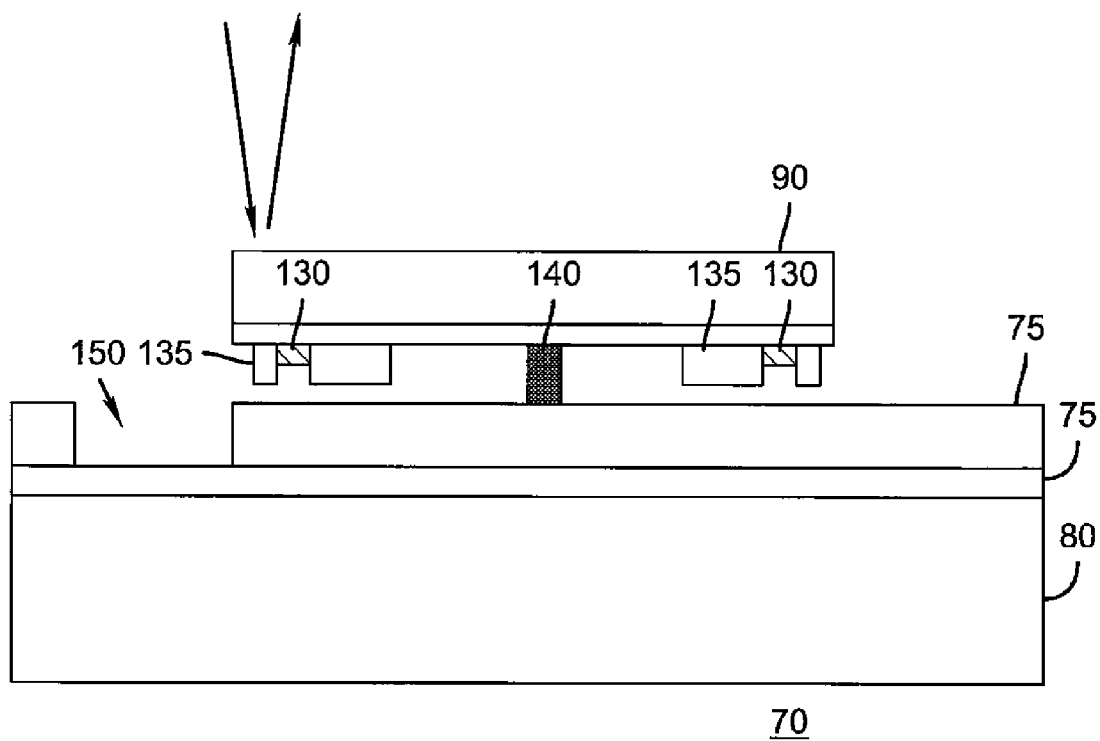

Referring to FIGS. 4d-4e, there is shown a process for forming the channels 150 of FIG. 4c in a self-aligned manner to the die 90. It is noted that although FIGS. 4d-4e illustrate the embodiment having two energy absorbing layers 75 covering the substrate 80, a single energy-absorbing layer is also generally adequate. A scanned source of radiation, for example a laser beam, ablates portions of the ablative film 70 until it reaches the edge of the die 90 where its energy is reflected away from the film 70, thereby stopping formation of the channel 150 precisely at the die edge, regardless of the position and angle of orientation of the die 90. If required, the positions of the non-precisely placed die 90 are detected with a camera and stored in a memory file. This file is interrogated upon scanning the energy beams and used to control the scanner to move beams toward the desired locations on the die 90 (typically the locations of the contact pads and typically perpendicular to the edge of the chip nearest the contact region, despite the fact that the chip may be oriented at an angle to the edge of the ablative film 70). It is noted that the die 90 are principally supported by the raised support structure 140 separating the contact regions 130 so that there is some space between the contact region 130 and the top surface of the ablative film 70.

Figure 5A:
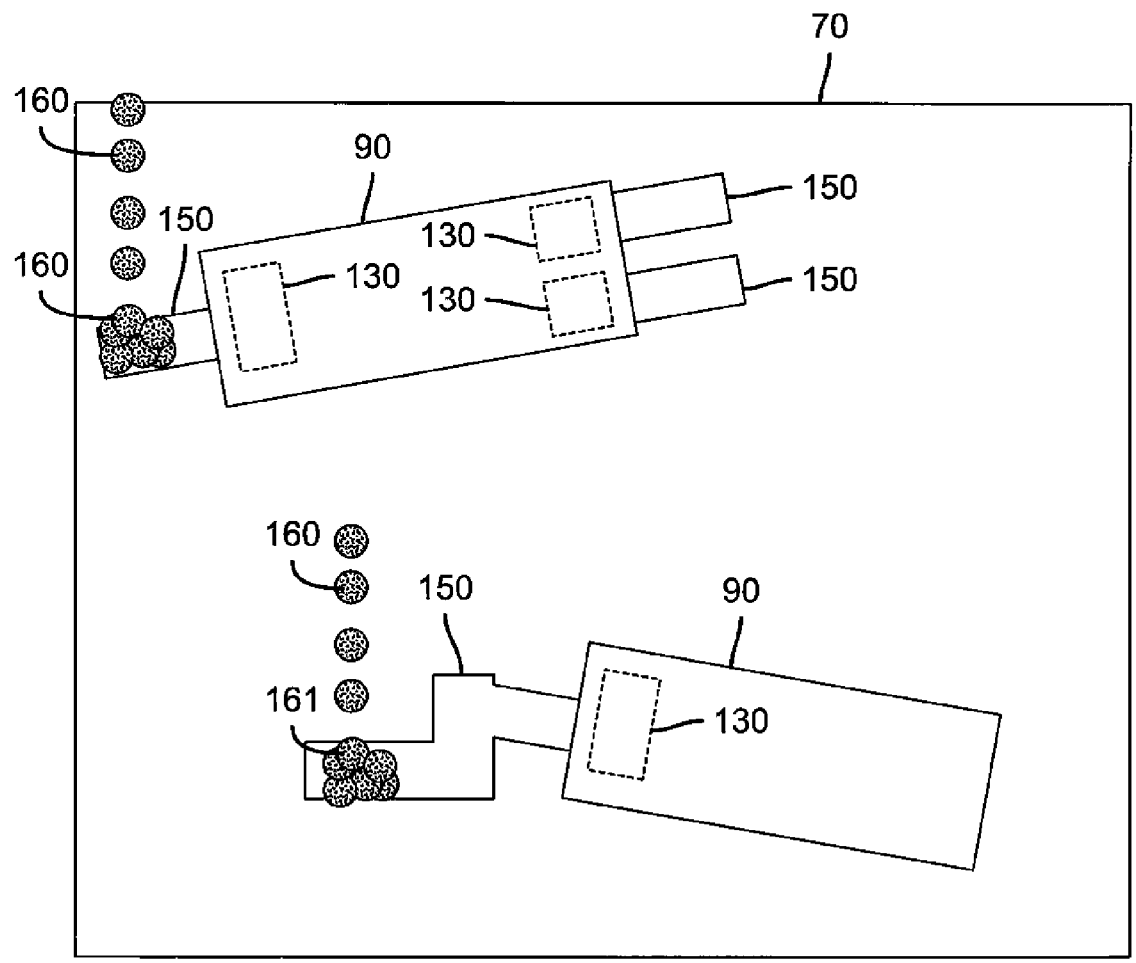
FIGS. 5a-5b illustrate deposition by inkjet printing means and by dropper or dipping means of a fluid, for example a conductive ink, into the ablated channels of FIG. 4c, as is well known in the arts of inkjet printing and of fluid coating.
Figure 5B:
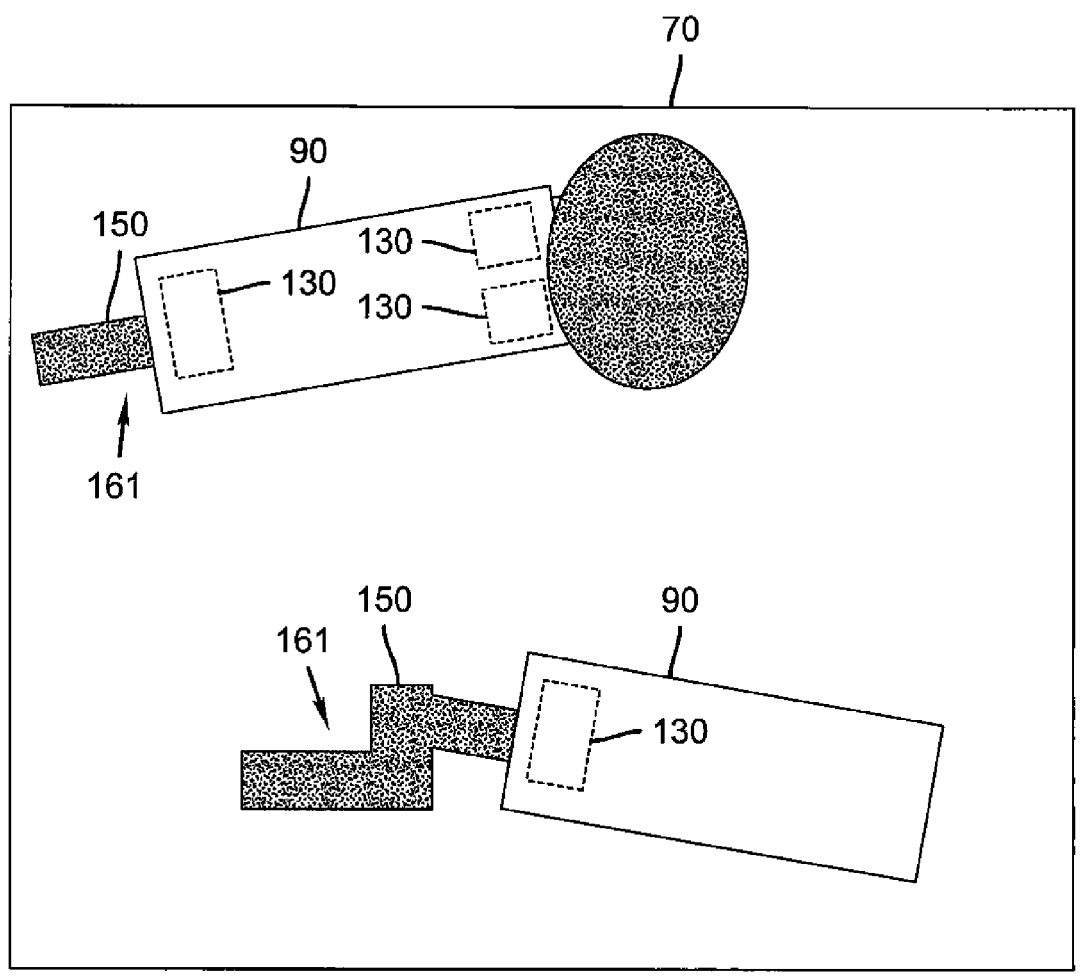

Referring to FIGS. 5a-5b, there is illustrated deposition by inkjet printing means and by dropper or dipping means of a fluid 160, for example a conductive ink 160a (shown later), into the ablated channels 150 of FIG. 4c, as is well known in the arts of inkjet printing and of fluid coating. FIG. 5a illustrates the process of dropping the conductive fluid 160 while it is actually occurring and FIG. 5b illustrates the final position of the deposited conductive fluid 160 which has been deposited by multiple drops. As is well known in the art of conductive fluid, the fluid typically hardens to form a solid, also denoted as 161. Hereafter, the shading of the figures does not differentiate between the fluid and the hardened fluid.

Figure 6A:
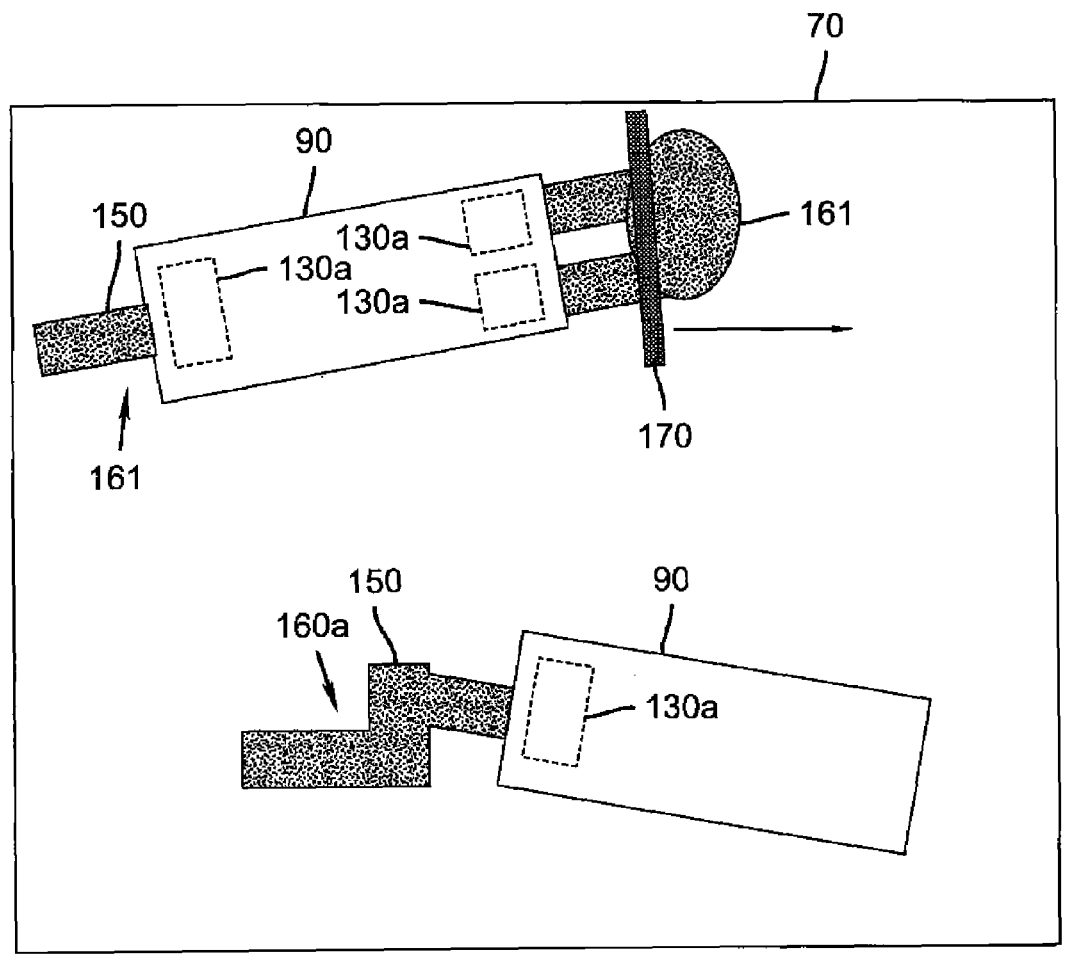
FIG. 6a illustrates one technique for removal of excess fluid deposition by dropper means of a fluid using a flexible blade.

Referring to FIG. 6a, there is illustrated one technique for removal of excess fluid 161 deposition by dropper means of a fluid using a flexible blade 170.

Figure 6B:
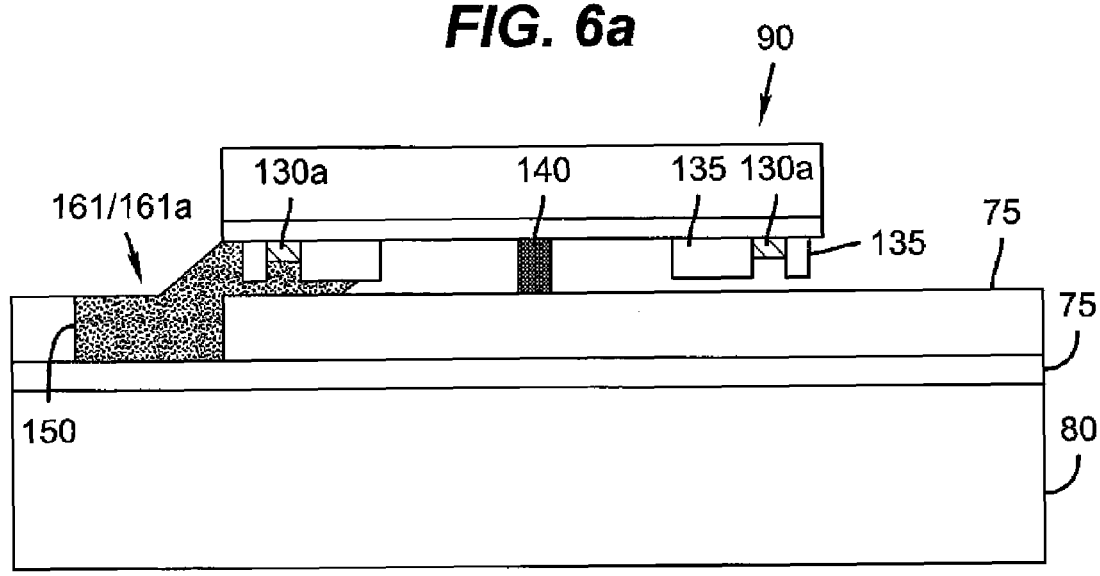
FIG. 6b shows a cross-sectional view of a die, channel, and deposited fluid as in FIG. 2d but in more detail.

Referring to FIG. 6b, there is shown a cross-sectional view of the die 90, channel 150, and deposited fluid 161 as in FIG. 5a but in more detail. In accordance with the present invention, the fluid 161 has wicked underneath a portion of the die 90 and has made physical contact with the contact region 130 of the die 90. This embodiment illustrates the case in which the connection to the die 90 is an electrical connection. For example, as is well know in the thin film materials art, an electrical connection can be formed from a deposited fluid 161a if the fluid contains a metallic precursor or is an electrically conductive polymeric material. The material in the channel 150, after annealing, is in electrical contact with contact region 130a. A connection so formed to the microsized device 90 enables the device to send and receive data in the form of digital or analog electrical signals. It is not necessary that the conductive material physically contact the contact region 130a as long as it is closely disposed, as is well know in the art of dielectric current detection. The contact regions 130a in FIG. 6b may include electrically responsive elements such as voltage or current sources or voltage or current detectors, well known in the art of MST devices. The supportive structure 140 in FIG. 6b aids wicking of the fluid 161a to the contact region, since it ensures that there is space between the top surface of the ablative film and the protective coating 135, as well as between the top surface of the ablative film and the contact region 130a. The supportive structure 140 in FIG. 6b also helps prevent wicking of the fluid 161a to the contact region 130a on the right side of the die due to its contact with the top surface of the ablative film.

Figure 7A:
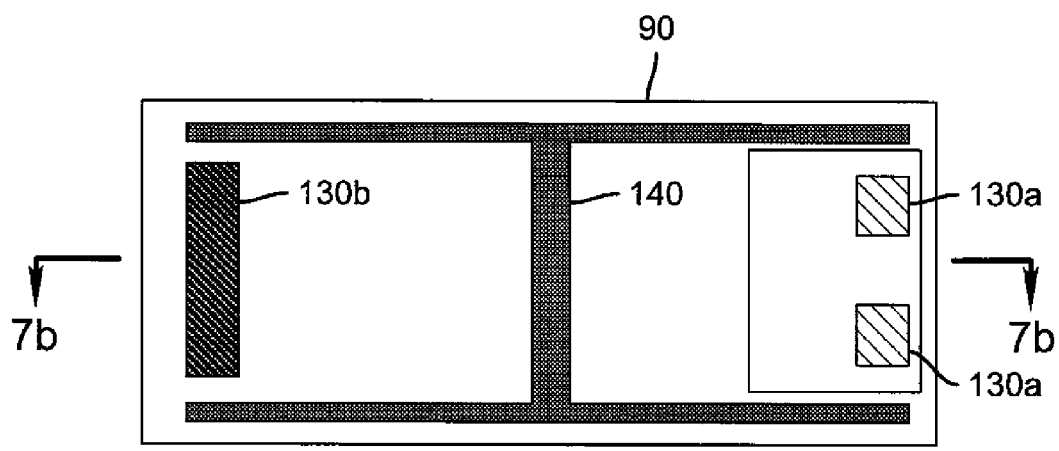
FIG. 7a-7c shows a cross-sectional view of a die, channel, and deposited fluid as in FIG. 2d but in more detail for the case in which the connection to the die is a photonic connection.
Figure 7B:
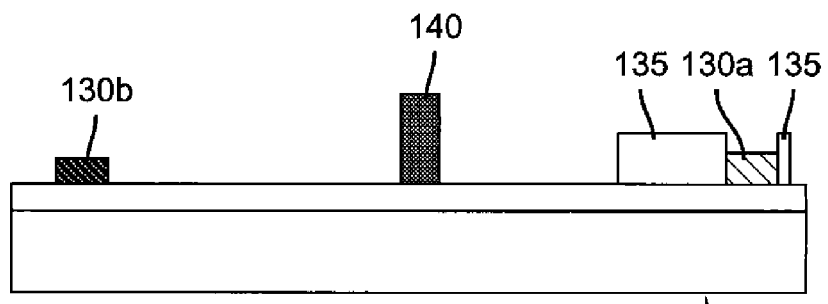
Figure 7C:
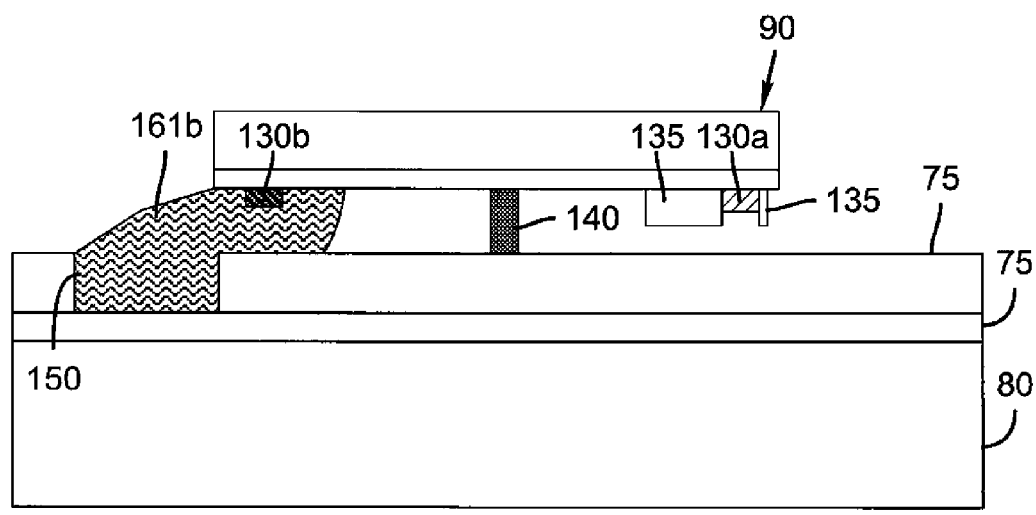

Referring to FIGS. 7a-7c, there is shown a cross-sectional view of the die 90, channel 150, and deposited fluid 160 as in FIG. 5a but in more detail for the case in which the connection to the die 90 is a photonic connection. In this case, the material 160 deposited in the channel 150 is optically transparent (designated by 161b). In accordance with the present invention, the fluid 161b has wicked underneath a portion of the die 90 and has made physical contact with the contact region 130b of the die 90. In the case that the fluid 161b is an optically transparent material, for example a polymer such as polycarbonate or benzo chlorohexal borene, the material 161b in the channel 150, after hardening or annealing, is in optical contact with the contact region 130b on the die. In this case, the contact region 130b comprises optically responsive elements, for example LED optical sources made from organic polymers, or photodetectors, made, for example, form deposited films such as ZnSe or doped silicon semiconductor junctions. A connection so formed to the microsized device 90 enables the device to send and receive data in the form of digital or analog optical signals. It is not necessary that the optically transmissive material physically contact the contact region 130b as long as it is closely disposed since light can travel across the gap between the transmissive material and the optical sensor. The supportive structure 140 in FIG. 7c aids wicking of the fluid 161b to the contact region on the left of the die, since it ensures that there is space between the top surface of the ablative film and the contact region 130b. The supportive structure 140 in FIG. 7c additionally prevents wicking of the fluid to the contact region 130b on the right side of the die due to its contact with the top surface of the ablative film.

It is noted that electrical contacts 130a may be disposed on the left portion of the die 90 and are connected as disclosed above.

Figure 8A:
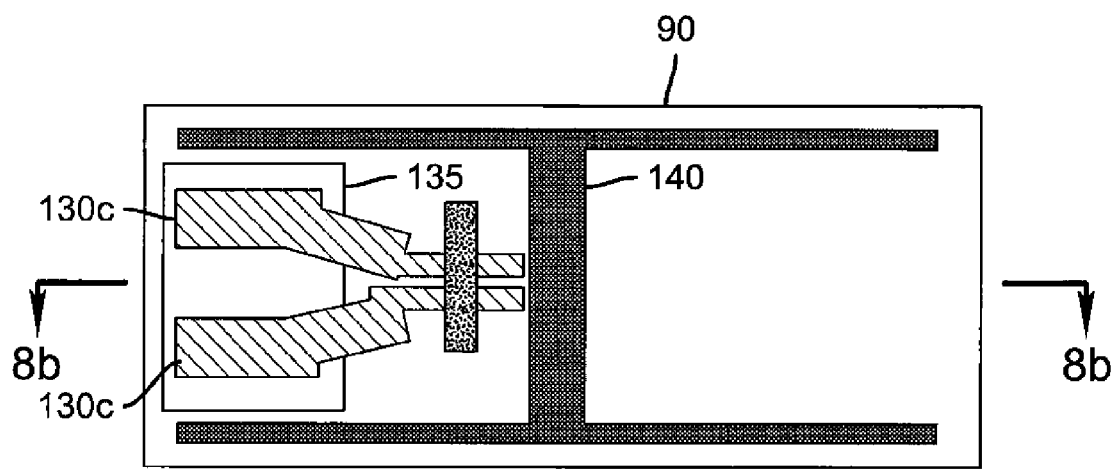
FIG. 8a-8c shows a cross-sectional view of a die, channel, and deposited fluid as in FIG. 2d but in more detail for the case in which the connection to the die is a magnetic connection.
Figure 8B:
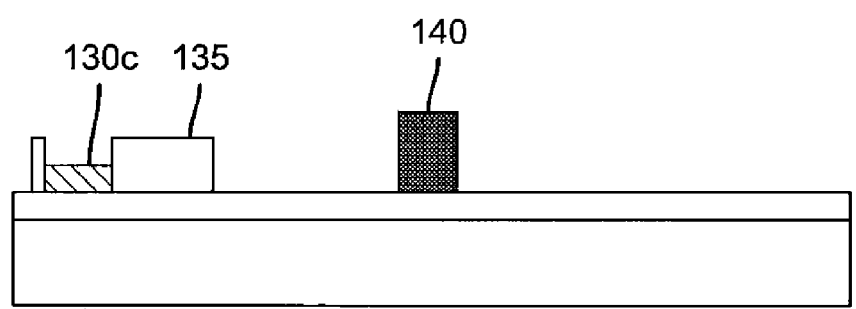
Figure 8C:
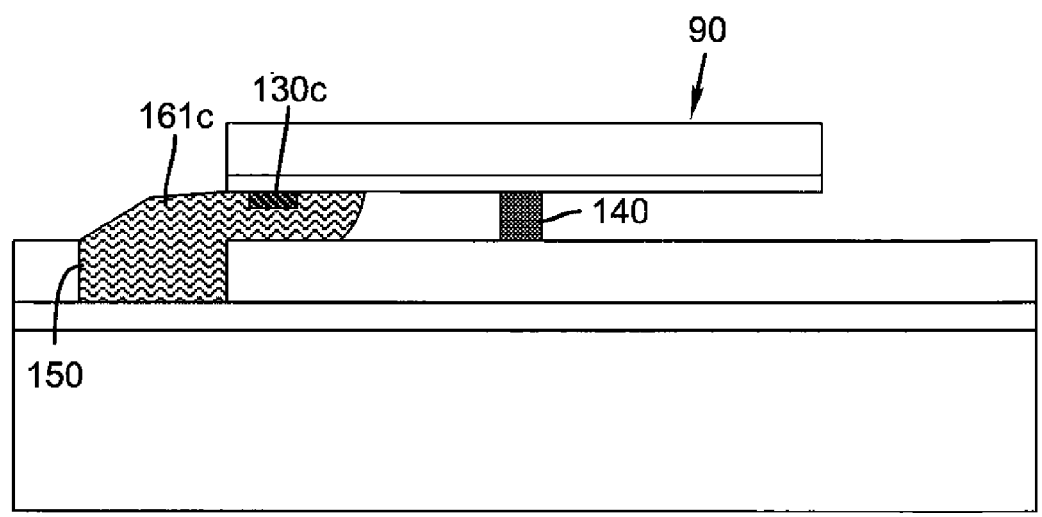

Referring to FIGS. 8a-8c, there is shown a cross-sectional view of a die 90, channel 150, and deposited fluid 161c as in FIG. 5a but in more detail for the case in which the connection to the die 90 is a magnetic connection. In this case, the material 161c deposited in the channel 150 is a magnetically active material having a high magnetic permittivity (designated as 161c). In accordance with the present invention, the fluid 161c has wicked underneath a portion of the die 90 and has made physical contact with the contact regions 130c of the die 90, which regions are shown as a pair of channels which serve to conduct a magnetic field to and from a contact region 130c which is sensitive to an applied field, for example, contact region 130c could be a Hall type magnetic field sensor. In the case that the fluid 161c is a magnetically active material, for example iron or iron alloys, the material in the channel 150, after hardening or annealing, is in magnetic communication with the contact regions 130c on the die 90. In this case, the contact regions 130c comprise a magnetically responsive circuit, for example a Hall sensor, or, a source of magnetic fields, for example, a moveable mechanical transducer having a magnetic portion, as is well known in the art of MST devices. A connection so formed to the microsized device 90 enables the device to send and receive data in the form of digital or analog magnetic signals. It is not necessary that the magnetically active material physically contact the contact regions 130c as long as it is closely disposed to the contact regions 130c, since a magnetic field can be sensed across a gap between the material and the field sensor.

Figure 9A:
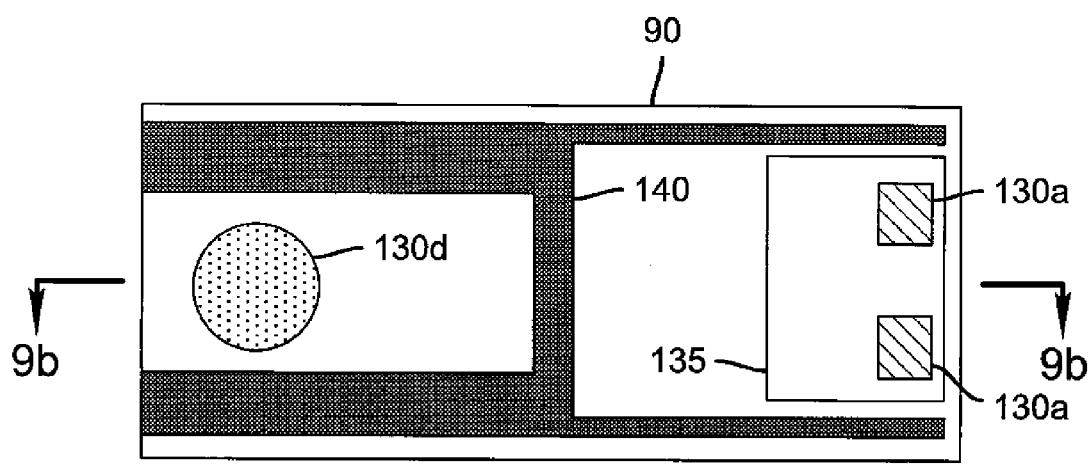
FIG. 9a-9c shows a cross-sectional view of a die, channel, and deposited overlayer for the case in which the connection to the die is a fluidic connection.
Figure 9B:
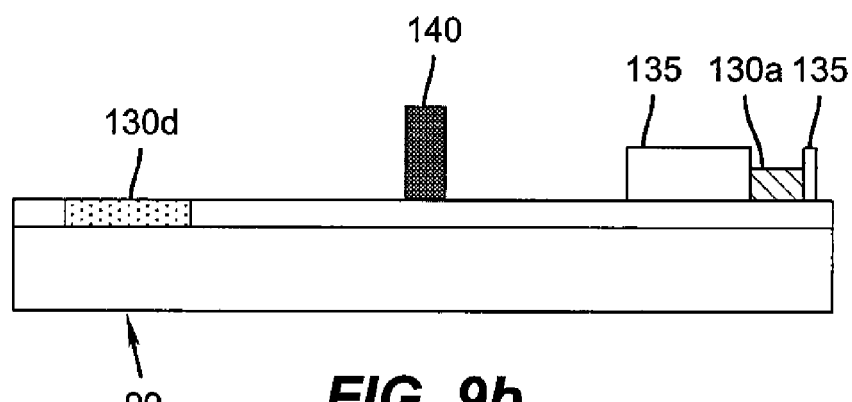
Figure 9C:
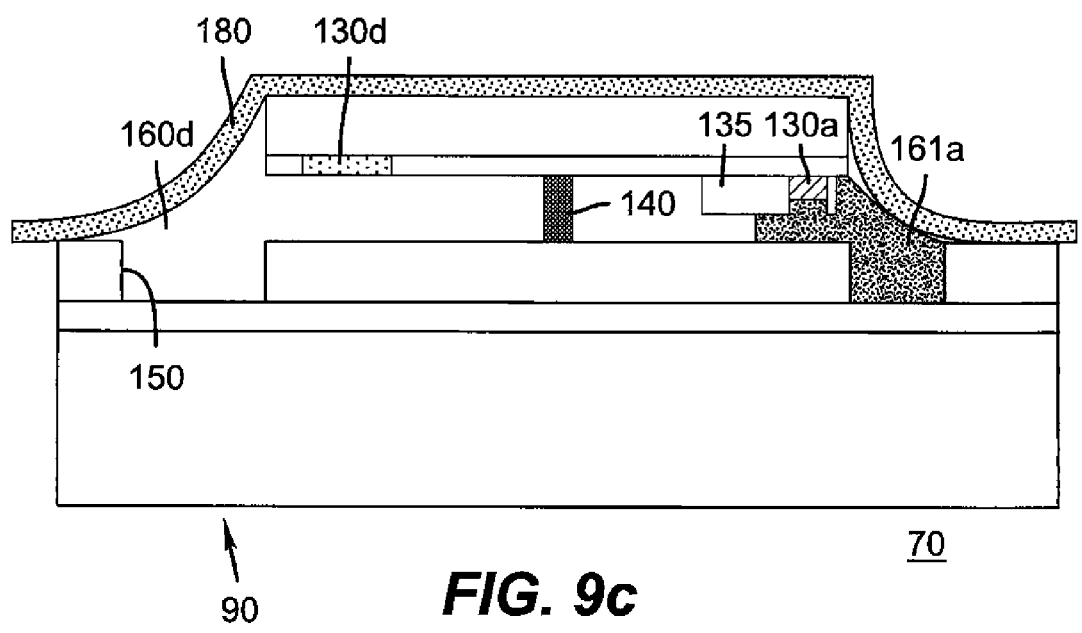

Referring to FIGS. 9a-9c, there is shown a cross-sectional view of a microsized device or die 90, channel 150, and an overlying conformal laminate film 180 for the case in which the connection to the die 90 is a fluidic connection. It is noted in the figures that color does not differentiate a channel 150 which is empty and a channel which is filled with externally sampled fluid 161d. In this case, the contact region 130d includes means responsive to the chemistry or rheology of the fluid 161d present in the channel 150, for example the contact region 130d may be a chemically sensitive field effect transistor (CHEM-FET) sensitive (which is designated as 130d), for example, to the ionic content of the externally sampled fluid 160d (for example a gas or liquid); or the contact region 130d may be a conductivity detector, a humidity detector, a gas sensor, or a molecularly specific sensor such as a MIP resonator. The contact region 130d may also be a fluidic opening built into the microdevice itself, to convey fluids to the device for biological analysis or processing. In this case, the microdevice may include pump means for drawing or dispensing the externally sampled fluid 161d in the channels 150. Externally sampled fluids 160d may include either liquids or gases. In one embodiment of this case, there is no material deposited in the channel 150 but a conformal laminate film 180 (FIG. 9c) has been placed at least over those portions of the die 90 where channels 150 have been formed to serve as a cap to the channel.

It is noted the left portion of the die 90 may include electrical contacts 130a which are connected as described above.

Alternatively (FIGS. 10a-10f), a sacrificial material may be placed in the channels 150, for example a phase change liquid such as a wax may be deposited in the channels and hardened by cooling. In accordance with this embodiment, the sacrificial fluid 161e may wick underneath a portion of the die 90 and make physical contact with the contact region 130d of the die 90. A fluid sealant may then be coated, for example by dip or spray coating over the entire ablative film or at least the portion having die and channels, and the sacrificial material 161e subsequently removed to form channels 150 for the externally sampled fluid 161d. The sacrificial material 161e may be removed (indicated by 161d), for example, by chemical dissolution or by heating to vaporize the material. In accordance with either procedure, a fluid channel 150 is formed in the ablative film in fluid communication with the contact region(s) of the die 90. A connection so formed to the microsized device enables the device 90 to respond to chemical content, for example the presence of salt in a fluid already present in the channel, or to fluid introduced and/or removed from the channel, as sensed, for example, by the pressure or the dielectric constant of the fluid. Similarly if the fluid is a gas, the sensor may detect molecular species such as ethane that diffuse or circulate in the channels.

Figure 10A:
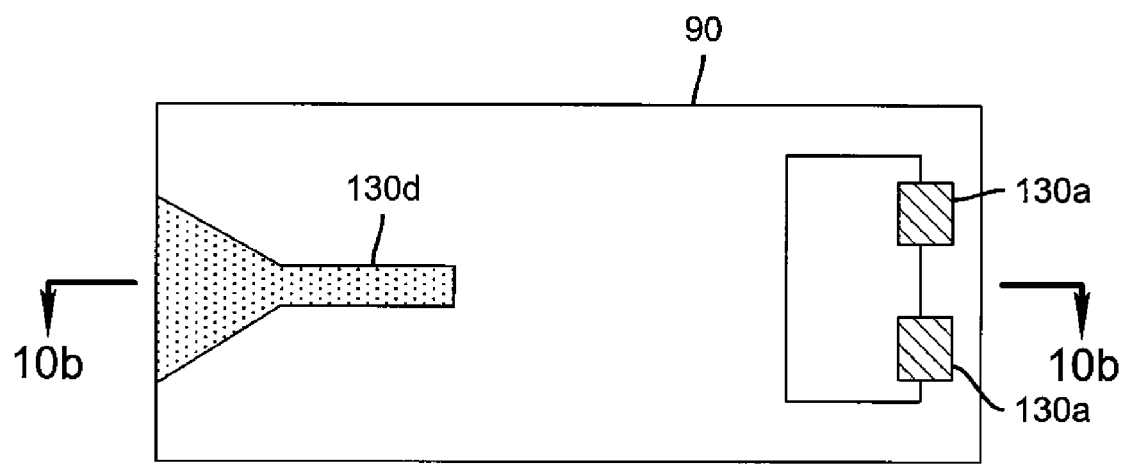
FIG. 10a-10f shows a cross-sectional view of a die, channel, and deposited overlayer for another exemplary case in which the connection to the die is a fluidic connection.
Figure 10B:
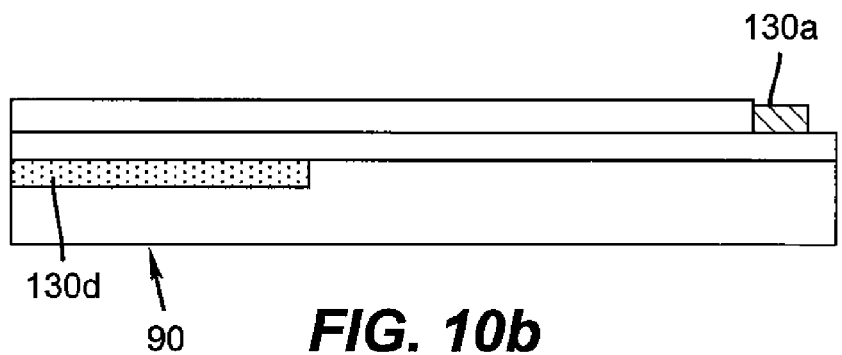
Figure 10C:
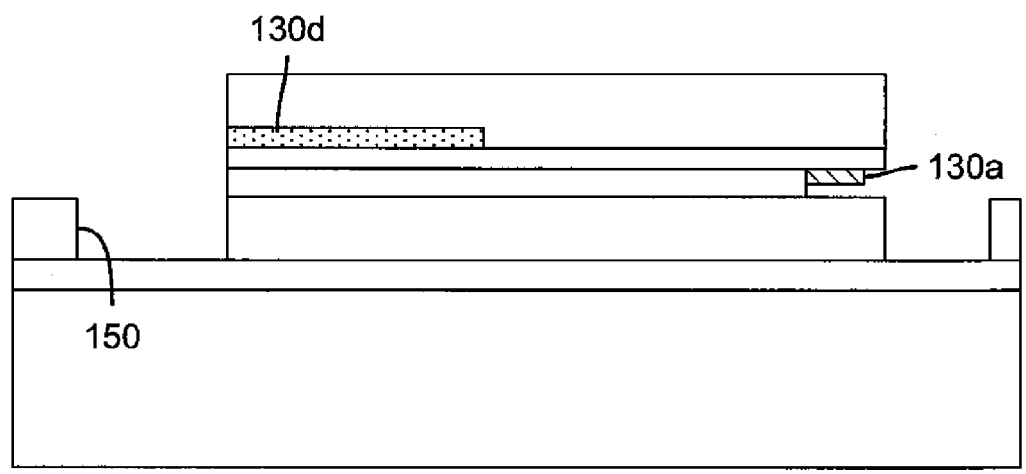
Figure 10D:
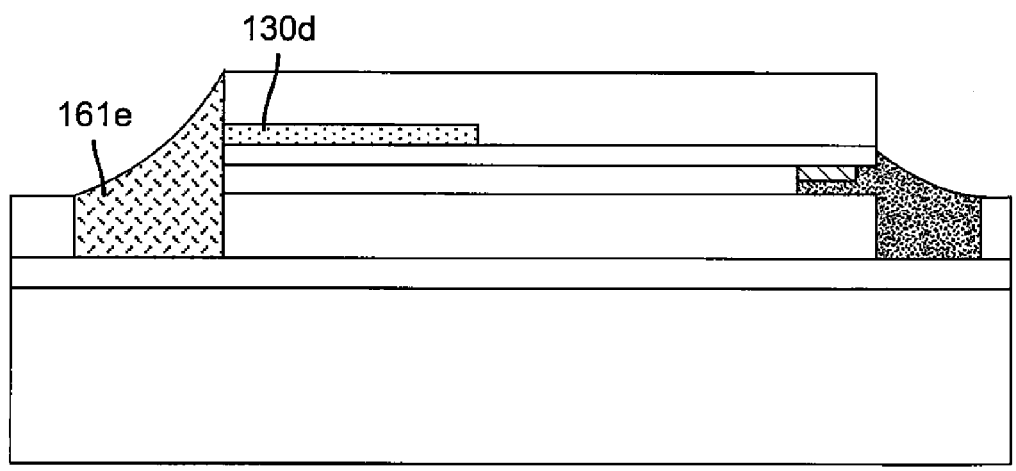
Figure 10E:
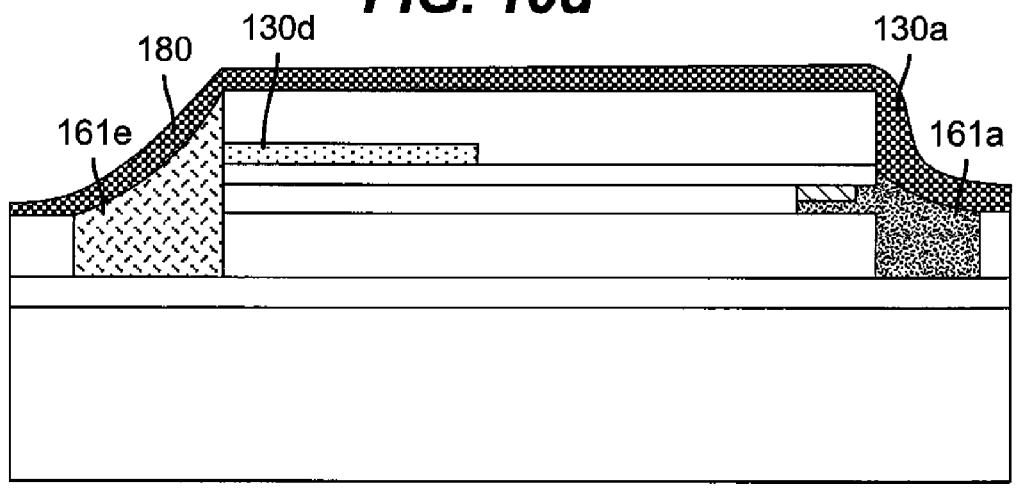
Figure 10F:
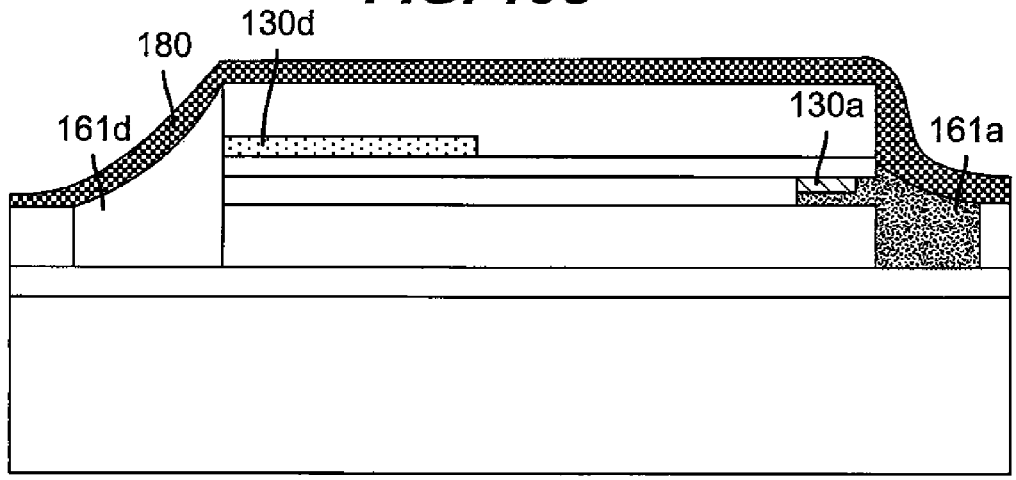

Referring to FIGS. 10a-10f, there is shown a cross-sectional view of a die 90, channel 150, and deposited overlayer for another exemplary case in which the connection to the die 90 is a fluidic connection. In this case, the contact region 130 is a fluidic opening built into the end of the microdevice itself, rather than an opening or a sensor defined on the surface of the device, to convey fluids to the device for biological analysis or processing. The microdevice may include pump means for drawing or dispensing fluid in the channels 150 and data analysis means to analyze chemical or biological properties of fluids in the microdevice, such fluid functions being well known in the field of micro total analysis system. In FIGS. 10a-10c, provision is also included on the right of the microdevice for channel connections that are electrical in nature, as discussed in association with FIG. 6a-6c. In fact, the present invention envisions the use of multiple types of connections to single die and between die 90, including connections of the electrical, photonic, magnetic, and fluidic types. In FIG. 10a-10c, the fluidic channels are formed using the process of fluid deposition of a sacrificial material followed by coating of a sealing layer and then removal of the sacrificial material, as discussed above.

Figure 11A:
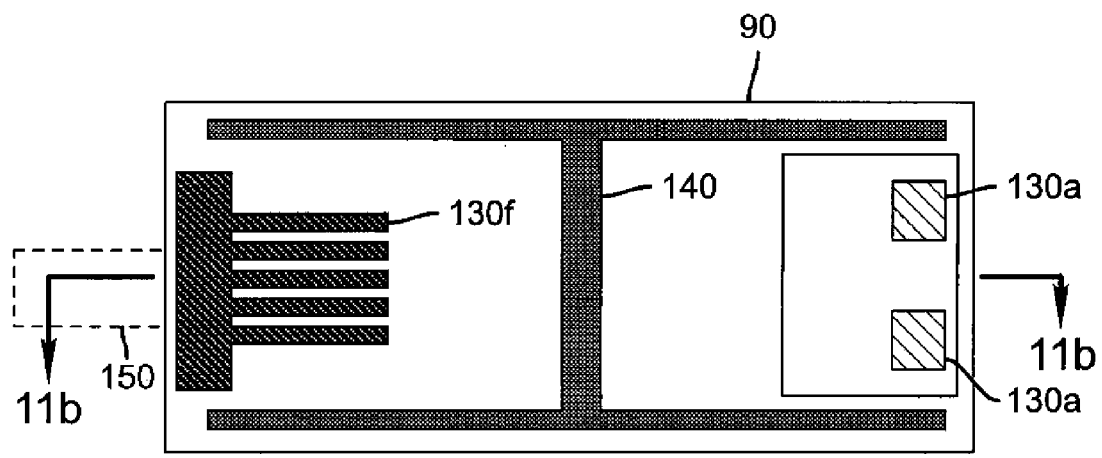
FIG. 11a-11c shows a cross-sectional view of a die, channel, and channel material for another exemplary case in which the connection to the die is a mechanical connection.
Figure 11B:
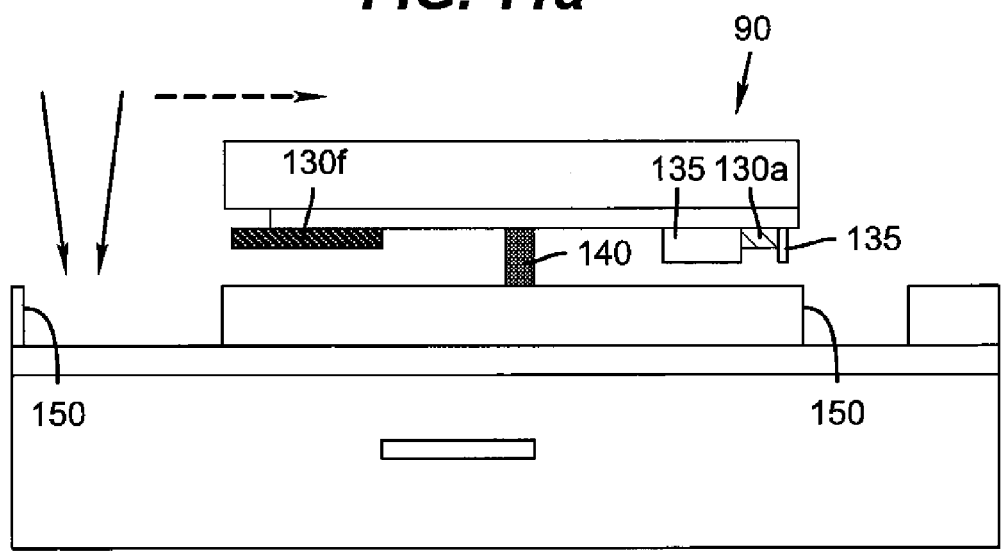
Figure 11C:
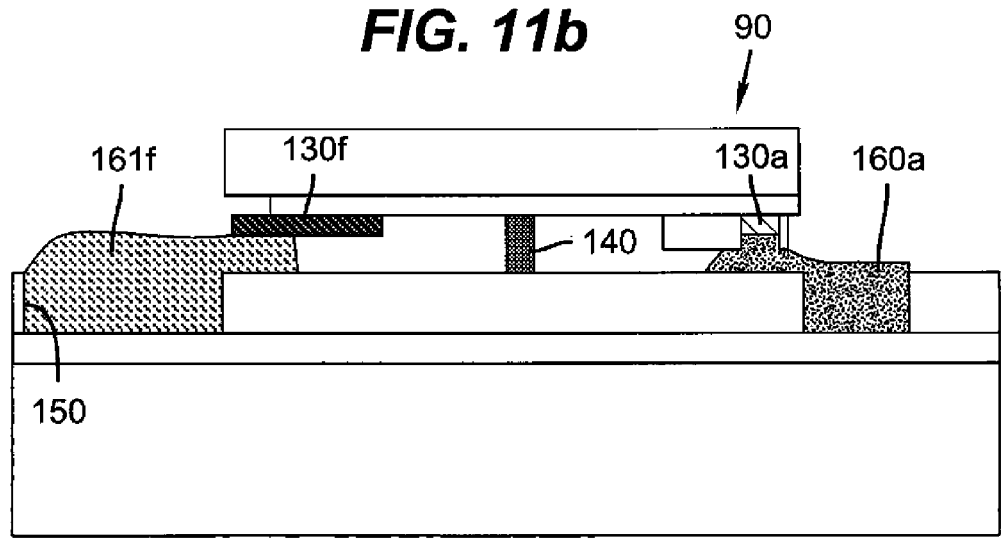

Referring to FIGS. 11a-11c, there is shown a cross-sectional view of a die 90, channel 150, and channel material 161f for another exemplary case in which the connection to the die 90 is a mechanical connection. In this case, the contact region 130f is mechanically responsive and therefore capable of sensing or producing static motion of the channel material (strain) or sensing or producing oscillatory motion, i.e. acoustic waves. Many microdevices are known in the art of MST technology, such as piezo cantilevers and electrostatic actuators, that are capable of all such functions. In FIG. 11a-11c, provision is also included on the right of the microdevice for channel connections that are electrical in nature, as discussed in association with FIG. 6a-6c. The present invention envisions the use of multiple types of connections to and between multiple types of die, including connections of the electrical, photonic, magnetic, mechanical, and fluidic types.

Figure 12A:
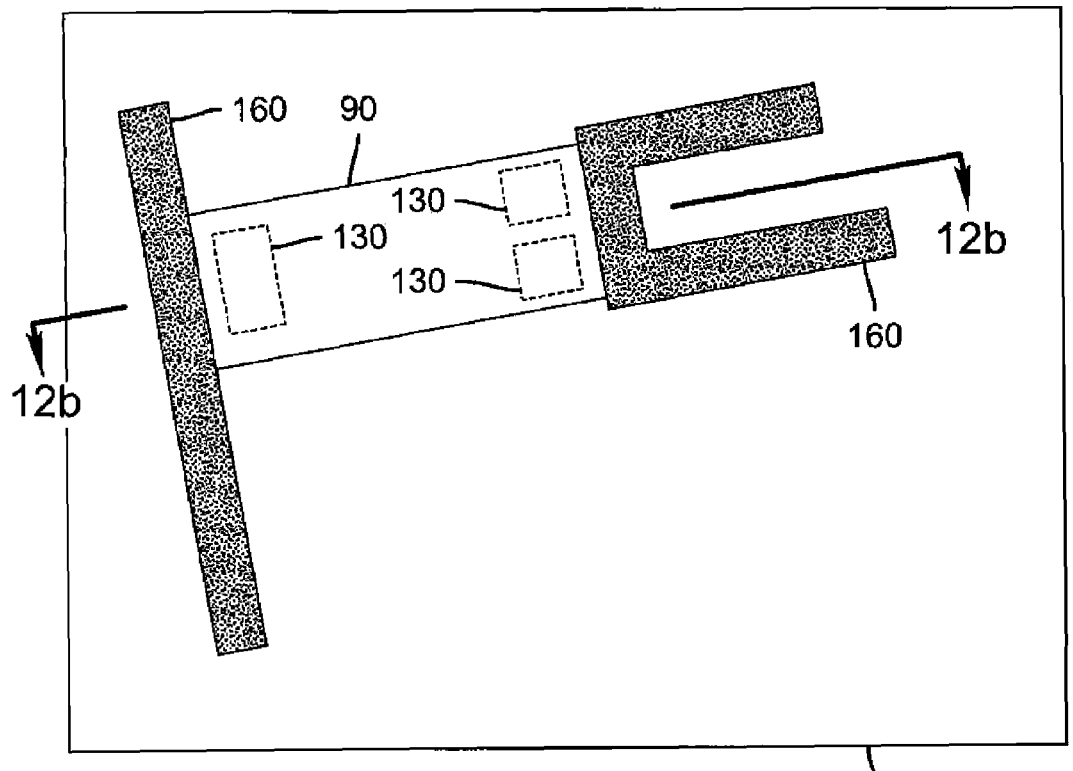
FIG. 12a-12b shows a top and cross-sectional view of a die, channel, and channel material for the case in which the connection to the die is remote, that is the material in the channel is close to the contact region of the die but not in physical contact.
Figure 12B:
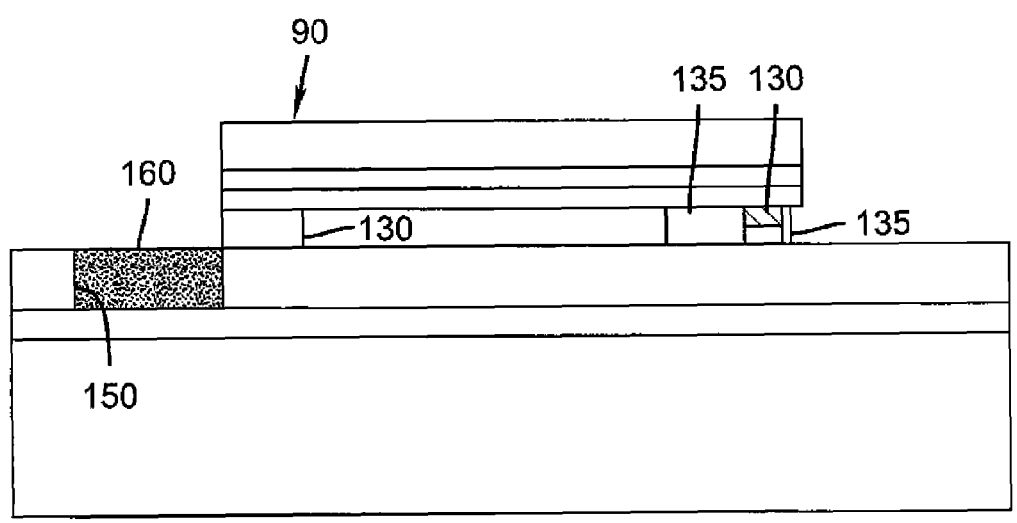

Referring to FIGS. 12a-12b, there is shown a top and cross-sectional view of a die 90, channel 150, and channel material 160 for the case in which the connection to the die 90 is remote, that is the material in the channel 150 is close to the contact region 130 of the die 90 but not in physical contact. As shown in FIG. 12b, which contemplates the case of a fluid 160 deposited in the channel 150, no wicking of the fluid 160 has occurred under the die 90. This may be accomplished by choosing the surface of the die 90 and the fluid 160 so that the interfacial surface tension is low and does not favor wicking, for example aqueous based fluids will not generally wick under a die that is Teflon coated. In this case, the contact region 130 is still capable of sensing or receiving or sending electrical, photonic, magnetic, mechanical, and fluidic connections but at a reduced sensitivity. Many microdevices are know in the art of MST, such as magnetic detectors and temperature sensors that can detect small changes in fields, produced by say a current flow depicted on the right side of FIG. 12a, or by small changes in temperature, produced, say, by the flow of a warm fluid as depicted on the left side of FIG. 12a.

Figure 13:
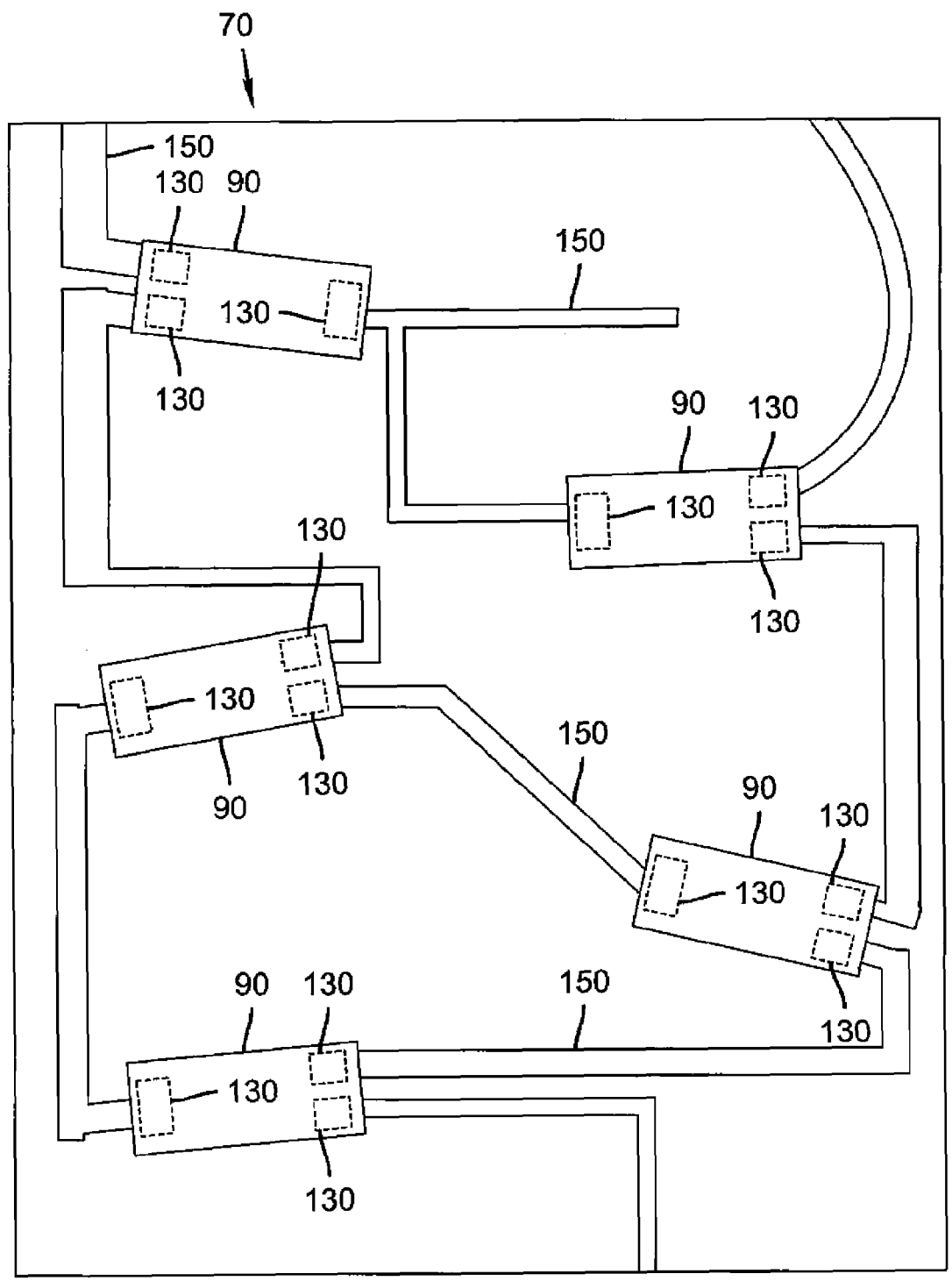
FIG. 13 illustrates by top view multiple connections of multiple types, including connections of the electrical, photonic, magnetic, mechanical, and fluidic types, to multiple types of microsized devices, including devices that generate and respond to electrical, photonic, magnetic, mechanical, and fluidic signals.

Finally, referring to FIG. 13, there is illustrated a top view of an ablative film 70 having multiple microsized devices with multiple connections of multiple types, including connections of the electrical, photonic, magnetic, mechanical, and fluidic types. Such arrays of interconnected microsized devices, including devices that generate and respond to electrical, photonic, magnetic, mechanical, and fluidic signals, function as microsystems, as is well known in the MST art. As has been discussed, and as shown in FIG. 13, the present invention contemplates that the connections are made to devices that are not precisely positioned on the ablative film. Channels 150 can be formed in a self aligned manner by focused radiation (e.g. lasers) by detecting, for example with a digital camera, the positions of the microsized devices, storing this information in a memory file, and using the information from such files to scan the focused radiation beams toward the desired locations on the die. (typically the locations of the contact pads).

The invention has been described with reference to a preferred embodiment. However, it will be appreciated that variations and modifications can be effected by a person of ordinary skill in the art without departing from the scope of the invention.

PARTS LIST 5 ablative film
10 substrate
20 energy-absorbing layer
30 multiple layers
40 channel
50 base
60 conductor
70 ablative film
75 energy-absorbing layer
80 substrate
90 die
100 channel
110 metallic bond pads
120 liquid
130 contact regions
130a conductive contacts
130b optical contacts
130c magnetic contacts
130d external contacts
130f mechanical contact
135 protective layers
140 raised support structure
150 channels
160 fluid
160a conductive ink
160d externally sampled fluid
161 hardened liquid (solid)
161a conductive material/deposited fluid
161b optical connection
161c magnetic connection
161d external connection
161e sacrificial connection
161f mechanical connection
170 flexible blade
180 conformal laminate film

The invention claimed is:

1. A method for connecting microsized devices mounted on a printing plate, the method comprising the steps of:
   (a) providing an ablative printing plate;
   (b) mounting at least a first and second microsized device, each having either one or more electrical or optical connections, upon the printing plate;
   (c) ablating a microsized channel in the printing plate after mounting of the first and second microsized devices on the printing plate and between each of the microsized devices;
   (d) placing either a conductor or optical element in the channel; and
   (e) connecting the conductor or optical element between the electrical or optical connection of the first and second microsized devices.

2. The method as in claim 1 further comprising placing a wickable substance in the channel or an enhanced channel for providing efficient connections for either the electrical or optical connections.

3. The method as in claim 1 further comprising placing a curable substance in the channel or an enhanced channel for stabilizing the either the electrical or optical element in the channel.

4. The method as in claim 1 further comprising placing an adhesive substance in the channel or an enhanced channel for further stabilizing either the electrical or optical element.

5. The method as in claim 1 further comprising the step of providing an electrical device as either the first or second microsized device.

6. The method as in claim 5 further comprising the step of providing an active electrical device as the electrical device.

7. The method as in claim 5 further comprising the step of providing a passive electrical device as the electrical device.

8. The method as in claim 1 further comprising the step of having an embossed portion in the ablative printing plates for receiving the microsized device.

9. The method as in claim 1 further comprising the step of providing a plurality of bond pads along opposing edges of the microsized device.

10. The method as in claim 1 further comprising placing an adhesive on either the microsized device or ablative printing plate for mounting purposes.

11. The method as in claim 1 further comprising the step of placing a micro-fluidic device in the channel.

12. The method as in claim 1 further comprising the step of determining a position of the microsized device and storing the results.

13. The method as in claim 12 further comprising the step of placing one or more ablative channels according to the stored results.

* * * * *